United States Patent
Srinivasan et al.

(10) Patent No.: US 10,157,915 B1
(45) Date of Patent: Dec. 18, 2018

(54) CAPACITOR WITH IMPROVED VOLTAGE COEFFICIENTS

(71) Applicant: Texas Instruments Incorporated, Dallas, TX (US)

(72) Inventors: Bhaskar Srinivasan, Allen, TX (US); Shih Chang Chang, Allen, TX (US); Poornika Gayathri Fernandes, Murphy (IN); Haowen Bu, Plano, TX (US); Guru Mathur, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/793,607

(22) Filed: Oct. 25, 2017

(51) Int. Cl.
| | |
|---|---|
| H01L 27/08 | (2006.01) |
| H01L 49/02 | (2006.01) |
| H01L 27/06 | (2006.01) |
| H01L 27/108 | (2006.01) |
| H01L 29/66 | (2006.01) |
| H01L 21/02 | (2006.01) |
| H01L 21/82 | (2006.01) |

(52) U.S. Cl.
CPC ...... H01L 27/0805 (2013.01); H01L 27/0629 (2013.01); H01L 27/10805 (2013.01); H01L 27/10852 (2013.01); H01L 27/10861 (2013.01); H01L 28/40 (2013.01); H01L 29/66181 (2013.01); H01L 21/0228 (2013.01); H01L 21/02164 (2013.01); H01L 21/02178 (2013.01); H01L 21/82 (2013.01)

(58) Field of Classification Search
CPC ............. H01L 27/0805; H01L 27/0629; H01L 27/10805; H01L 27/10852; H01L 27/10861; H01L 28/40; H01L 29/66181; H01L 21/02164; H01L 21/02178; H01L 21/0228; H01L 21/82
See application file for complete search history.

(56) References Cited

U.S. PATENT DOCUMENTS 6,576,526 B2 * 6/2003 Kai ................... H01L 21/31122
257/E21.009
2002/0119622 A1 * 8/2002 Steigerwald ............ H01L 28/40
438/244

(Continued)

FOREIGN PATENT DOCUMENTS

EP        525464 A1    2/1993

*Primary Examiner* — Karen Kusumakar
(74) *Attorney, Agent, or Firm* — Rose Alyssa Keagy; Charles A. Brill; Frank D. Cimino

(57) ABSTRACT

A microelectronic device includes a capacitor having a lower plate of interconnect metal, a capacitor dielectric layer with a lower silicon dioxide layer, a silicon oxy-nitride layer, and an upper silicon dioxide layer, and an upper plate over the upper silicon dioxide layer. The silicon oxy-nitride layer has an average index of refraction of 1.60 to 1.75 at a wavelength of 248 nanometers. To form the microelectronic device, the lower silicon dioxide layer, the silicon oxy-nitride layer, and the upper silicon dioxide layer are formed in sequence over an interconnect metal layer. An upper plate layer is patterned to form the upper plate, leaving the lower silicon dioxide layer and at least half of the silicon oxy-nitride layer over the interconnect metal layer. An interconnect mask is formed of photoresist over the upper plate and the silicon oxy-nitride layer, using the silicon oxy-nitride layer as an anti-reflection layer.

21 Claims, 17 Drawing Sheets

(56) References Cited

U.S. PATENT DOCUMENTS

| | | |
|---|---|---|
| 2003/0052365 A1 | 3/2003 | Chaudhry |
| 2007/0105332 A1* | 5/2007 | Wofford .................. H01L 28/40 |
| | | 438/381 |
| 2007/0236863 A1* | 10/2007 | Lee .......................... H01G 4/10 |
| | | 361/313 |

* cited by examiner

CAPACITOR WITH IMPROVED VOLTAGE COEFFICIENTS

FIELD

This disclosure relates to the field of microelectronic devices. More particularly, this disclosure relates to capacitors in microelectronic devices.

BACKGROUND

A microelectronic device may include a capacitor in the interconnect region. The lower plate of the capacitor may be a metal layer that is part of an interconnect level, to reduce cost and complexity of the microelectronic device. There are several desirable characteristics of the capacitor. A first desirable characteristic is high capacitance density, which may be expressed as a high ratio of the capacitance to the area occupied by the capacitor. A second desirable characteristic is low variations in the capacitance over the range of voltages applied to the capacitor. A third desirable characteristic is high reliability, which may be understood as meeting the first and second desirable characteristics for an expected operational lifetime of the microelectronic device under the expected operating conditions of the microelectronic device. A fourth desirable characteristic is compatibility of the capacitor fabrication operation with the patterning steps used to form the etch mask for the interconnect level containing the lower plate of the capacitor. Such a desirable characteristic places limitations on the thickness and composition of the capacitor dielectric layer over the lower plate. Attaining all four desirable characteristics simultaneously has been problematic.

SUMMARY

A microelectronic device which includes a capacitor having a lower plate of interconnect metal is disclosed. The capacitor dielectric layer has a lower silicon dioxide layer over the lower plate, a silicon oxy-nitride layer over the lower silicon dioxide layer, and an upper silicon dioxide layer over the silicon oxy-nitride layer. An upper plate of the capacitor is located over the upper silicon dioxide layer. The silicon oxy-nitride layer has an average index of refraction of 1.60 to 1.75 at a wavelength of 248 nanometers. A method of forming the microelectronic device is disclosed. An interconnect metal layer is formed on the microelectronic device. The lower silicon dioxide layer, the silicon oxy-nitride layer, and the upper silicon dioxide layer are formed in sequence over the interconnect metal layer. An upper plate layer is formed over the upper silicon dioxide layer. The upper plate layer is patterned to form the upper plate, leaving the lower silicon dioxide layer and at least half of the silicon oxy-nitride layer over the interconnect metal layer. An interconnect mask is formed of photoresist over the upper plate and the silicon oxy-nitride layer, covering areas for the lower plate and for an interconnect. The interconnect layer is removed where exposed by the interconnect mask, leaving the lower plate and the interconnect.

DETAILED DESCRIPTION

Figure 1:
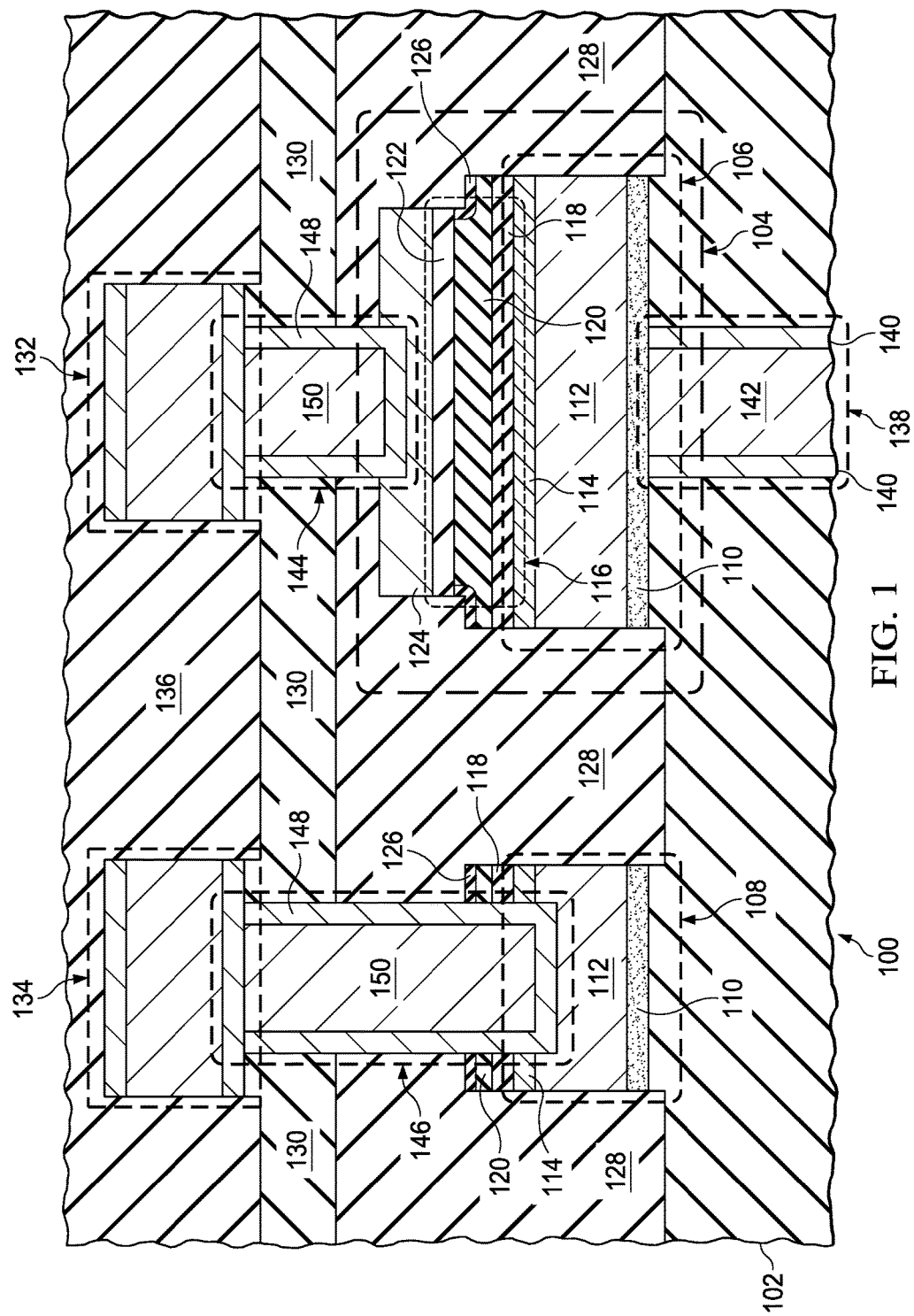
FIG. 1 is a cross section of an example microelectronic device which includes a capacitor having a lower plate of interconnect metal.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent application is related and hereby incorporated by reference: U.S. patent application Ser. No. 15/793,690 (filed simultaneously with this application). With its mention in this section, this patent application is not admitted to be prior art with respect to the present invention.

A microelectronic device includes a capacitor in the interconnect region. The lower plate of the capacitor is a metal layer that is part of an interconnect level. A capacitor dielectric layer on the lower plate includes a lower silicon dioxide layer over the lower plate, a silicon oxy-nitride layer over the lower silicon dioxide layer, and an upper silicon dioxide layer over the silicon oxy-nitride layer. The lower silicon dioxide layer has a thickness of 3 nanometers to 7 nanometers. The silicon oxy-nitride layer has a thickness of 15 nanometers to 25 nanometers. The silicon oxy-nitride layer has an average value of the real part of the index of refraction, commonly referred to as simply the index of refraction, and commonly represented by the letter n, of 1.60 to 1.75 at a wavelength of 248 nanometers. The silicon oxy-nitride layer may have an average value of the imaginary part of the index of refraction, commonly represented by the letter k, of 0.025 to 0.040 at a wavelength of 248 nanometers. The upper silicon dioxide layer has a thickness of 3 nanometers to 7 nanometers. An upper plate of the capacitor is located over the upper silicon dioxide layer. The upper plate has a thickness of 150 nanometers to 250 nanometers. The upper plate is recessed from a lateral perimeter of the lower plate. The capacitor dielectric layer provides an anti-reflection layer on the lower plate, where exposed by the upper plate, at a wavelength of 248 nanometers. In this context, an anti-reflection layer provides a reflectivity less than 30 percent at a wavelength of 248 nanometers in a photolithography tool used to form a photoresist pattern over the metal layer that is part of the interconnect level.

To form the microelectronic device, an interconnect metal layer is formed on a dielectric layer of the microelectronic device. The lower silicon dioxide layer, the silicon oxy-nitride layer, and the upper silicon dioxide layer are formed in sequence, and optionally in situ, over the interconnect metal layer. An upper plate layer is formed over the upper silicon dioxide layer. The upper plate layer is patterned to form the upper plate, leaving the lower silicon dioxide layer and at least half of the silicon oxy-nitride layer over the interconnect metal layer outside of the upper plate. A layer of photoresist is formed over the upper plate and the silicon oxy-nitride layer, covering areas for the lower plate and for interconnects. The lower silicon dioxide layer and the remaining portion of the silicon oxy-nitride layer over the interconnect metal layer advantageously provide an anti-reflection layer for the photoresist. The photoresist is patterned by a photolithographic process to form an interconnect mask defining areas for a lower plate of the capacitor and interconnects in the interconnect metal layer. The silicon oxy-nitride layer having an average value of the index of refraction of 1.60 to 1.75 may provide sufficient anti-reflection performance to enable patterning the photoresist at a pitch less than 500 nanometers. A lower average index of refraction of the silicon oxy-nitride layer would not enable patterning the photoresist at a pitch less than 500 nanometers. Use of the lower silicon dioxide layer and the remaining portion of the silicon oxy-nitride layer to provide the anti-reflection layer may advantageously reduce cost and complexity of the photolithographic process compared to applying a separate anti-reflection layer such as an organic bottom anti-reflection coat (BARC). The interconnect metal layer is etched using the interconnect mask to concurrently form the lower plate of the capacitor and the interconnects.

The capacitor has a capacitance density greater than 1.2 femtofarad per square micron (fF/μm2), and a breakdown voltage greater than 20 volts, provided by the capacitor dielectric layer having the silicon oxy-nitride layer between the lower silicon dioxide layer and the upper silicon dioxide layer, and by the silicon oxy-nitride layer having an average value of the index of refraction of 1.60 to 1.75 at a wavelength of 248 nanometers. A lower average index of refraction of the silicon oxy-nitride layer would undesirably produce a lower capacitance density. Furthermore, the capacitor has a linear voltage coefficient of −20 parts per million (ppm) to +20 ppm, and a quadratic voltage coefficient of −5 ppm to +5 ppm, over a voltage range of −10 volts to +10 volts. A capacitance of the capacitor, as a function of a voltage applied to the upper plate relative to the lower plate, may be expressed as $$C(V)=C_0\times[1+(\alpha\times V^2)+(\beta\times V)]$$

where V is the voltage applied to the upper plate relative to the lower plate,

C(V) is the capacitance at the applied voltage V, $C_0$ is the capacitance at zero applied voltage, β is the linear voltage coefficient, and α is the quadratic voltage coefficient.

The values of the linear voltage coefficient and the quadratic voltage coefficient result from the dielectric constant of the silicon oxy-nitride layer in combination with having the silicon oxy-nitride layer between the lower silicon dioxide layer and the upper silicon dioxide layer, and advantageously provide a variation in the capacitance less than 250 parts per million over the range of −15 volts to +15 volts. A higher average index of refraction of the silicon oxy-nitride layer would produce an undesirable higher value of the quadratic voltage coefficient. The structure of the capacitor dielectric layer, in particular a low defect density at interfaces between the lower plate and the lower silicon dioxide layer, between the lower silicon dioxide layer and the silicon oxy-nitride layer, and between the silicon oxy-nitride layer and the upper silicon dioxide layer, further advantageously provides reliable operation greater than 10 years under operating conditions of 85° C.

It is noted that terms such as "top," "over," "above," and "below" may be used in this disclosure. These terms should not be construed as limiting the position or orientation of a structure or element, but should be used to provide spatial relationship between structures or elements. For the purposes of this disclosure, the term "lateral" is understood to refer to a direction parallel to a plane of the top surface of the microelectronic device, and the term "vertical" is understood to refer to a direction perpendicular to the plane of the instant top surface of the microelectronic device.

FIG. 1 is a cross section of an example microelectronic device which includes a capacitor having a lower plate of interconnect metal. The microelectronic device 100 has a lower dielectric layer 102 in an interconnect region of the microelectronic device 100. The lower dielectric layer 102 may include one or more sublayers of silicon dioxide, with a cap layer of silicon nitride or such. The lower dielectric layer 102 may be, for example, an inter-level dielectric (ILD) layer between successive levels of interconnects, or a pre-metal dielectric (PMD) layer between a substrate of the microelectronic device 100 and a first level of interconnects.

The capacitor 104 is located on the lower dielectric layer 102. The capacitor 104 includes a lower plate 106 on the lower dielectric layer 102. The microelectronic device 100 further includes a lower interconnect 108, separate from the lower plate 106, on the lower dielectric layer 102. The lower plate 106 and the lower interconnect 108 have similar structures, including an adhesion layer 110 on the lower dielectric layer 102, an aluminum layer 112 on the adhesion layer 110, and a cap layer 114 on the aluminum layer 112. The adhesion layer 110 may include one or more layers of titanium, titanium tungsten, titanium nitride, or such. The aluminum layer 112 may include primarily aluminum, with a few percent of titanium, silicon, copper, or such, to improve resistance to electromigration. The cap layer 114 may include titanium nitride or other electrically conductive material appropriate for reducing hillock formation in the underlying aluminum layer 112 so as to improve a breakdown voltage and reliability of the capacitor 104.

The capacitor 104 further includes a capacitor dielectric layer 116 on the lower plate 106. The capacitor dielectric layer 116 includes a lower silicon dioxide layer 118 on the lower plate 106, a silicon oxy-nitride layer 120 on the lower silicon dioxide layer 118, and an upper silicon dioxide layer 122 on the silicon oxy-nitride layer 120. The lower silicon dioxide layer 118 is 3 nanometers to 7 nanometers thick, and may contain a few atomic percent nitrogen, for example up to 5 atomic percent. The silicon oxy-nitride layer 120 is 15 nanometers to 25 nanometers thick, and has an average value of the real part of the index of refraction of 1.60 to 1.75 at a wavelength of 248 nanometers. The silicon oxy-nitride layer 120 may have an average value of the imaginary part of the index of refraction of 0.025 to 0.040 at a wavelength of 248 nanometers. The upper silicon dioxide layer 122 is 3 nanometers to 7 nanometers thick, and may contain a few atomic percent nitrogen, for example up to 5 atomic percent.

The capacitor 104 further includes an upper plate 124 on the capacitor dielectric layer 116. The upper plate 124 is 150 nanometers to 250 nanometers thick. The upper plate 124 may include one or more layers of titanium nitride, tantalum nitride, or such. The upper plate 124 is recessed from a lateral perimeter of the lower plate 106, and the lower silicon dioxide layer 118 and a portion of the silicon oxy-nitride layer 120 extend past the upper plate 124 on the lower plate 106. The portion of the silicon oxy-nitride layer 120 that extends past the upper plate 124 has a thickness that is at least half the thickness of the silicon oxy-nitride layer 120 under the upper plate 124. The portion of the silicon oxy-nitride layer 120 that extends past the upper plate 124 may have an oxidized zone 126 that is 2 nanometers to 8 nanometers thick, extending from a top surface of the silicon oxy-nitride layer 120. Furthermore in the instant example, the lower silicon dioxide layer 118 and the portion of the silicon oxy-nitride layer 120, including the oxidized zone 126, are located on the lower interconnect 108.

A lower intra-metal dielectric (IMD) layer 128 is disposed over the lower dielectric layer 102, the capacitor 104, and the lower interconnect 108. The lower IMD layer 128 may include one or more sublayers of dielectric material, for example an etch stop layer of silicon nitride, and a main dielectric layer of silicon dioxide or low-k dielectric material on the etch stop layer. A top surface of the lower IMD layer 128 may be planar, as indicated in FIG. 1. An ILD layer 130 is disposed on the lower IMD layer 128. The ILD layer 130 may include one or more dielectric sublayers, such as a main dielectric layer of silicon dioxide or low-k dielectric material on the lower IMD layer 128, and a cap layer of silicon nitride, silicon carbide, silicon oxy-nitride, silicon oxy-carbide, or the like, on the main dielectric layer. Other dielectric layer structures over the lower dielectric layer 102, the capacitor 104, and the lower interconnect 108 are within the scope of the instant example.

A first upper interconnect 132 is located on the ILD layer 130 over the upper plate 124. A second upper interconnect 134 is located on the ILD layer 130 over the lower interconnect 108. The first upper interconnect 132 and the second upper interconnect 134 have similar structures, as a result of being formed concurrently in a same interconnect level of the microelectronic device 100. The first upper interconnect 132 and the second upper interconnect 134 may have sublayers with similar compositions to the sublayers of the lower interconnect 108. An upper IMD layer 136 is disposed on the ILD layer 130, the first upper interconnect 132, and the second upper interconnect 134. The upper IMD layer 136 may have a similar structure to the lower IMD layer 128.

In the instant example, the lower plate 106 is electrically contacted by a lower connection 138, which may be a via to an interconnect below the lower plate 106 or may be a contact to a component such as a transistor or a resistor or to a substrate of the microelectronic device 100. The lower connection 138 may include a liner 140 and a fill metal 142 on the liner 140. The liner may include titanium, titanium nitride, tantalum, tantalum nitride, or other such diffusion barrier metal. The fill metal 142 may include tungsten or such other metal amenable to metal organic chemical vapor deposition (MOCVD) or atomic layer deposition (ALD) processes.

The first upper interconnect 132 is electrically coupled to the upper plate 124 through a first via 144, and the second upper interconnect 134 is electrically coupled to the lower interconnect 108 through a second via 146. The second via 146 extends through the lower silicon dioxide layer 118 and the portion of the silicon oxy-nitride layer 120 on the lower interconnect 108. In the instant example, the first via 144 and the second via 146 each have a liner 148 and a fill metal 150 on the liner 148. The liners 148 have similar compositions, as a result of being formed concurrently. The fill metals 150 also have similar compositions, as a result of being formed concurrently. The liners 148 may have similar compositions to the liner 140 of the lower connection 138, and the fill metals 150 may have similar compositions to the fill metal 142 of the lower connection 138. Having electrical connections between the capacitor 104 and the lower interconnect 108 to the upper interconnects 132 and 134 in the same interconnect level may advantageously provide a more compact and simpler configuration compared with more complicated connections, advantageously reducing a cost of the microelectronic device 100.

Figure 2:
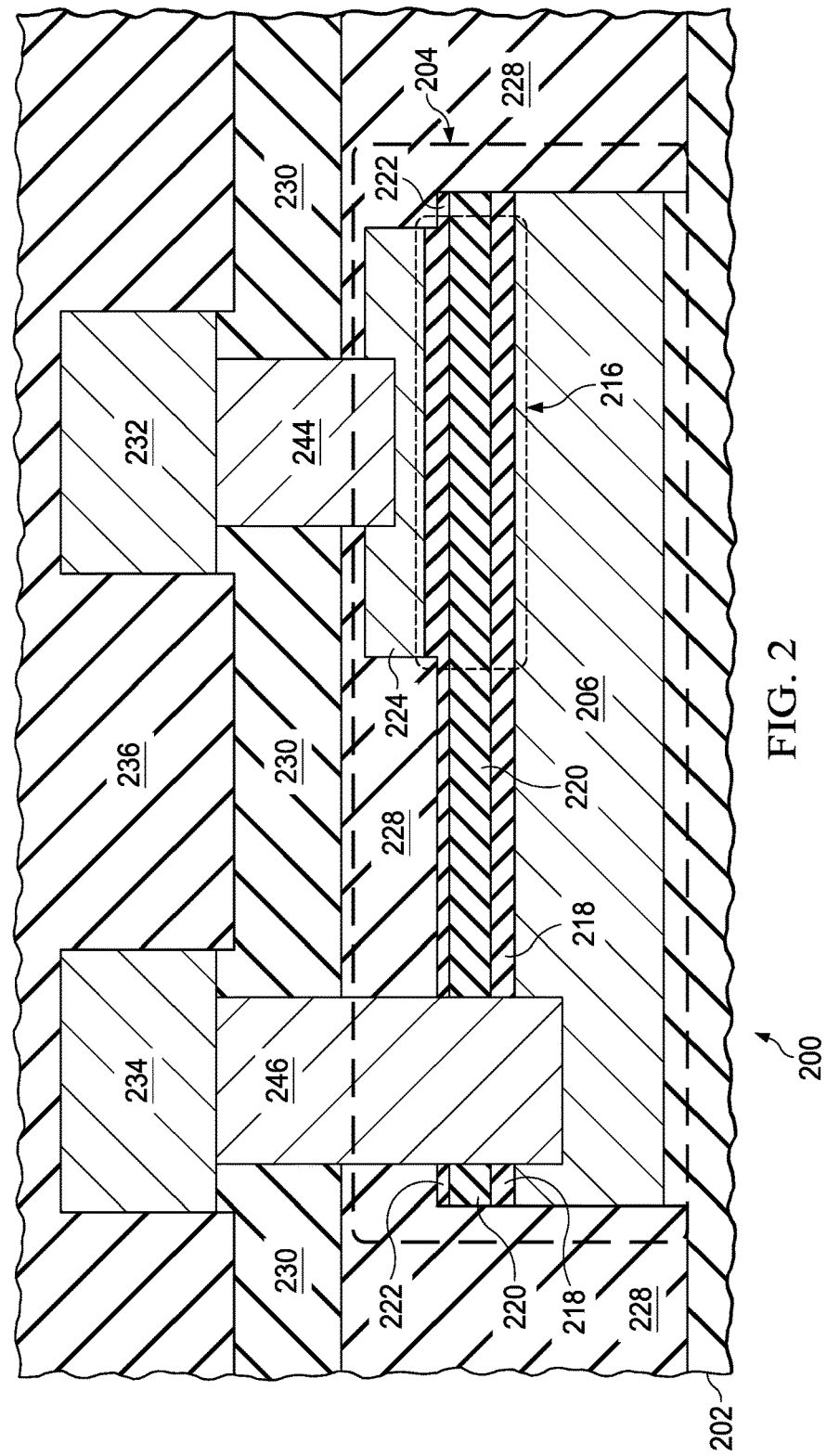
FIG. 2 is a cross section of another example microelectronic device which includes a capacitor having a lower plate of interconnect metal.

FIG. 2 is a cross section of another example microelectronic device which includes a capacitor having a lower plate of interconnect metal. The microelectronic device 200 has a lower dielectric layer 202 in an interconnect region of the microelectronic device 200. The capacitor 204 is located on the lower dielectric layer 202. The capacitor 204 includes a lower plate 206 on the lower dielectric layer 202. The lower plate 206 may have a structure and composition similar to interconnects on the lower dielectric layer 202. The capacitor 204 further includes a capacitor dielectric layer 216 on the lower plate 206. The capacitor dielectric layer 216 includes a lower silicon dioxide layer 218 on the lower plate 206, a silicon oxy-nitride layer 220 on the lower silicon dioxide layer 218, and an upper silicon dioxide layer 222 on the silicon oxy-nitride layer 220. The lower silicon dioxide layer 218, the silicon oxy-nitride layer 220, and the upper silicon dioxide layer 222 have structures and compositions as disclosed in reference to the capacitor dielectric layer 116 of FIG. 1. The capacitor 204 further includes an upper plate 224 on the capacitor dielectric layer 216. The upper plate 224 is 150 nanometers to 250 nanometers thick, and may have the composition disclosed in reference to the upper plate 124 of FIG. 1. In the instant example, the upper plate 224 is recessed from a lateral perimeter of the lower plate 206, and the lower silicon dioxide layer 218, the silicon oxy-nitride layer 220, and a portion of the upper silicon dioxide layer 222 extend past the upper plate 224 on the lower plate 206. The silicon oxy-nitride layer 220 may optionally have an oxidized zone, not shown in FIG. 2, extending from a top surface of the silicon oxy-nitride layer 220 in an area that extends past the upper plate 224.

A lower IMD layer 228 is disposed over the lower dielectric layer 202 and the capacitor 204. An ILD layer 230 is disposed on the lower IMD layer 228. Other dielectric layer structures over the lower dielectric layer 202 and the capacitor 204 are within the scope of the instant example. A first upper interconnect 232 is located on the ILD layer 230 over the upper plate 224. A second upper interconnect 234 is located on the ILD layer 230 over the lower plate 206 extending past the upper plate 224. The first upper interconnect 232 and the second upper interconnect 234 are in a same interconnect level of the microelectronic device 200. An upper IMD layer 236 is disposed on the ILD layer 230, the first upper interconnect 232, and the second upper interconnect 234. In the instant example, the first upper interconnect 232 is electrically coupled to the upper plate 224 through a first via 244, and the second upper interconnect 234 is electrically coupled to the lower plate 206 through a second via 246. The second via 246 extends through the portion of the upper silicon dioxide layer 222, the silicon oxy-nitride layer 220, and the lower silicon dioxide layer 218 on the lower plate 206. The first via 244 and the second via 246 may have similar structures and compositions, as a result of being formed concurrently. Having electrical connections between the capacitor 204 and the lower plate 206 to the upper interconnects 232 and 234 in the same interconnect level may advantageously provide a more compact and simpler configuration compared with more complicated connections, advantageously reducing a cost of the microelectronic device 200.

Figure 3A:
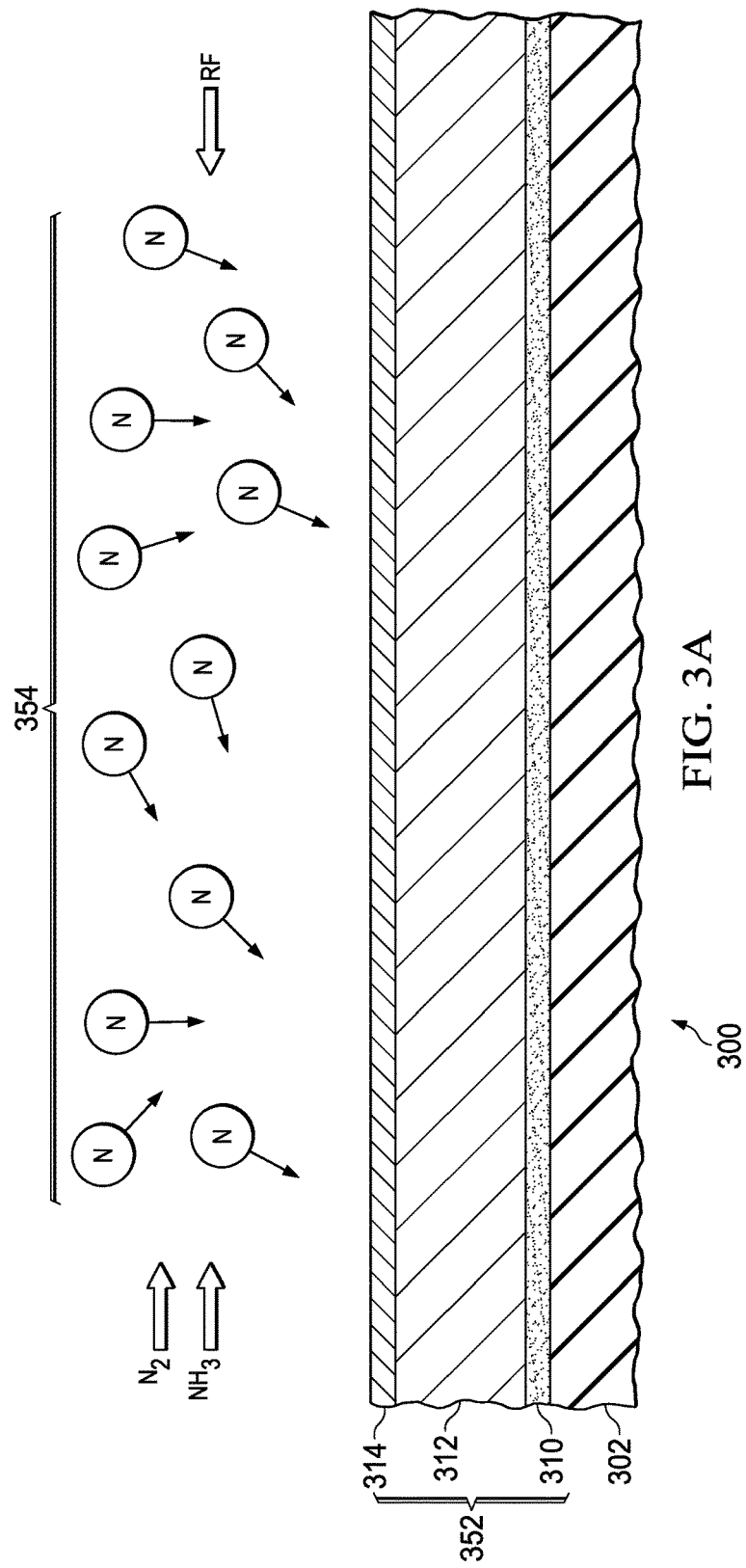
FIG. 3A through FIG. 3O are cross sections of a microelectronic device which includes a capacitor having a lower plate of interconnect metal, depicted in successive stages of an example method of formation.
Figure 3B:
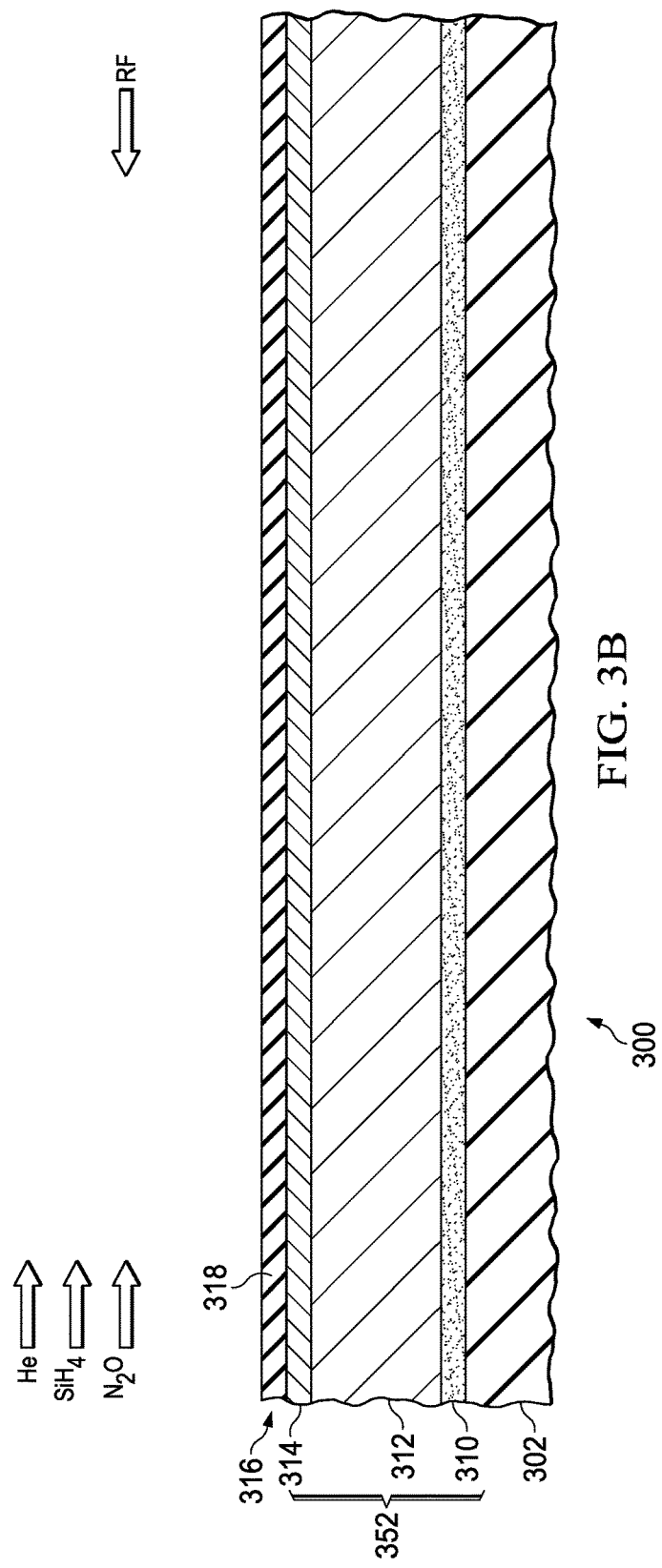
Figure 3C:
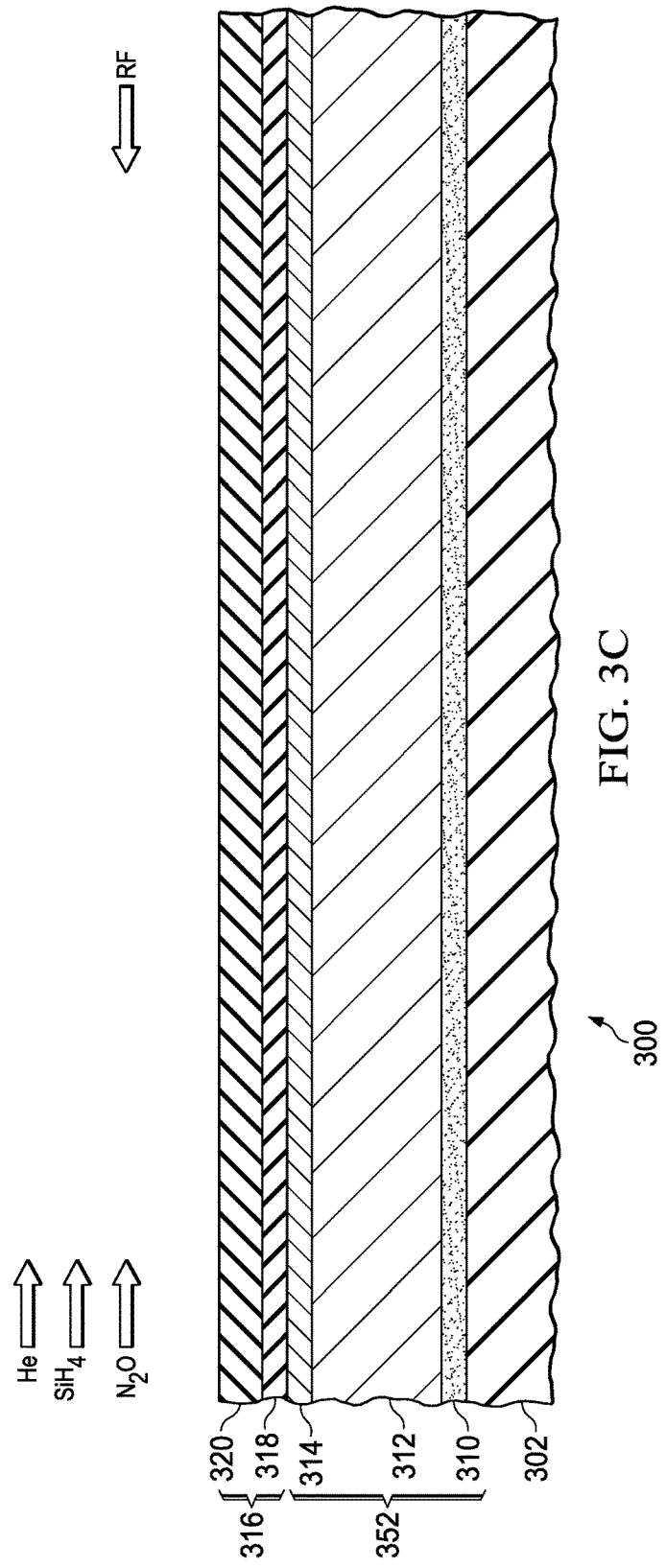
Figure 3D:
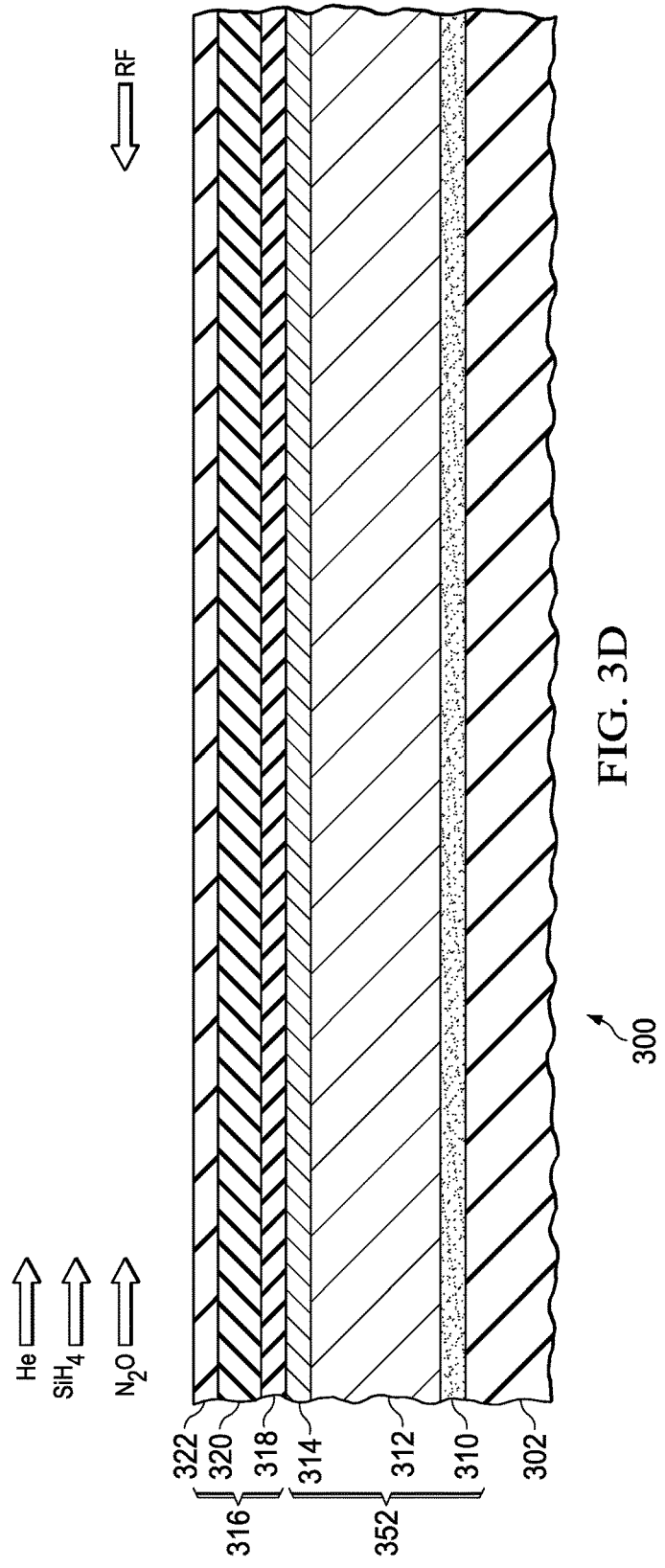
Figure 3E:
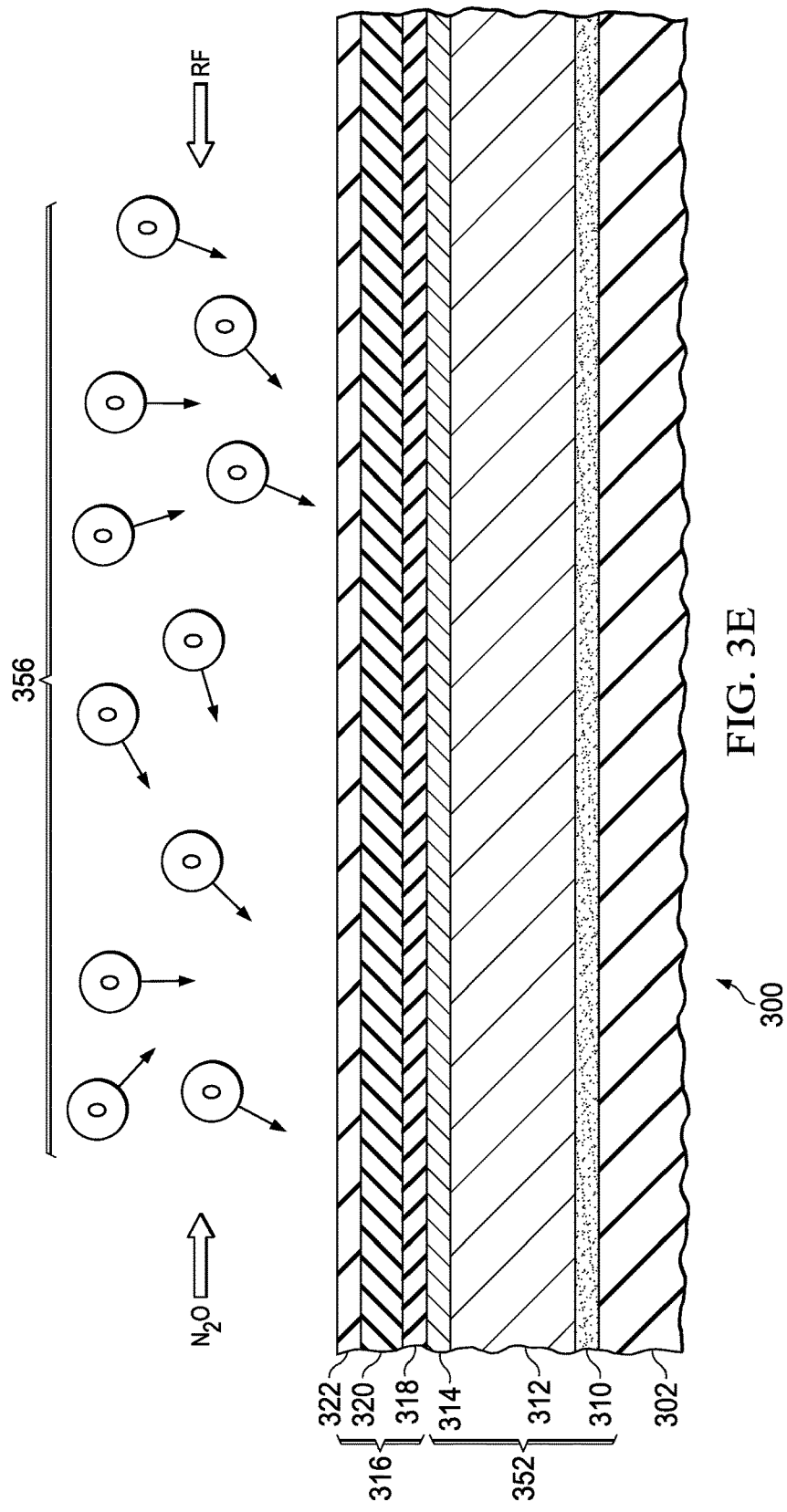
Figure 3F:
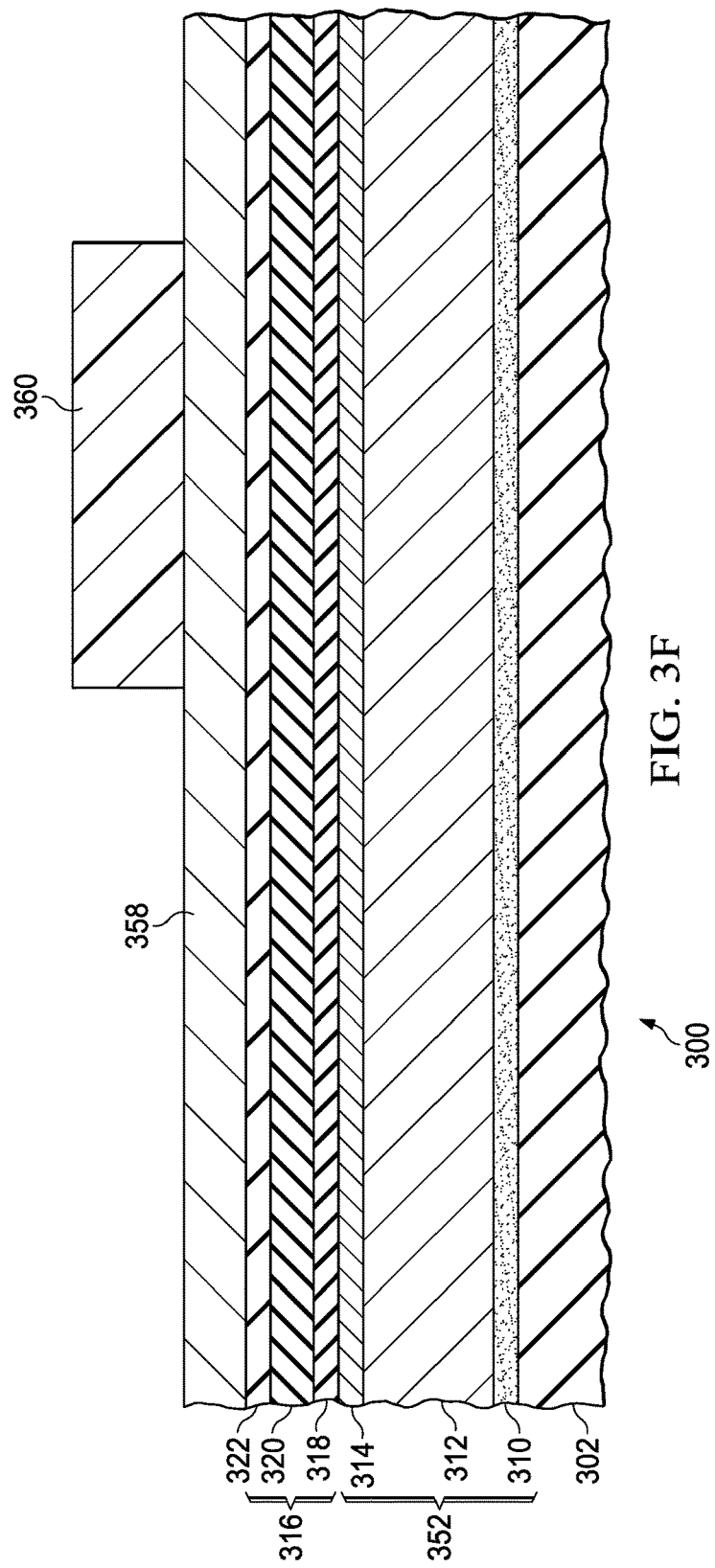
Figure 3G:
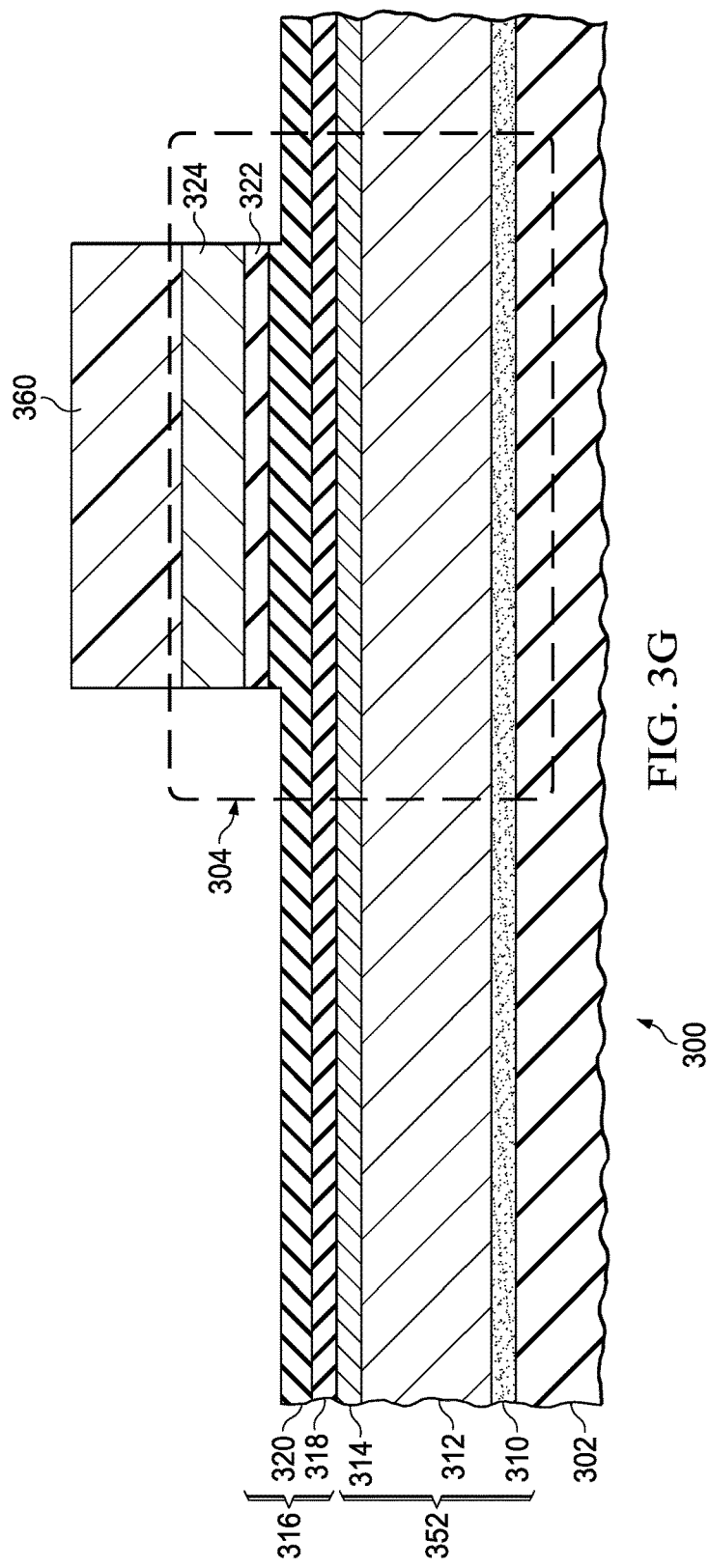
Figure 3H:
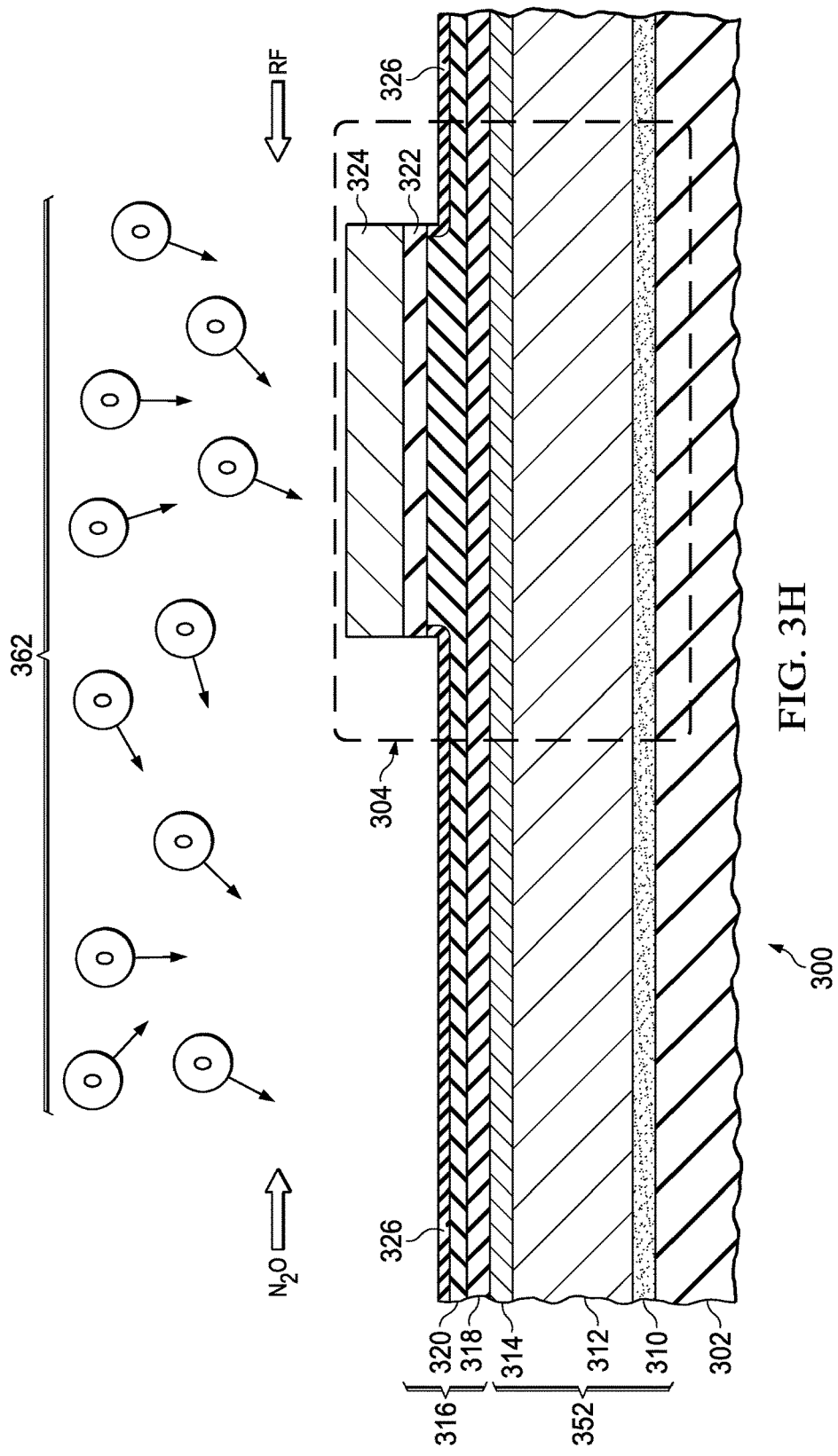
Figure 3I:
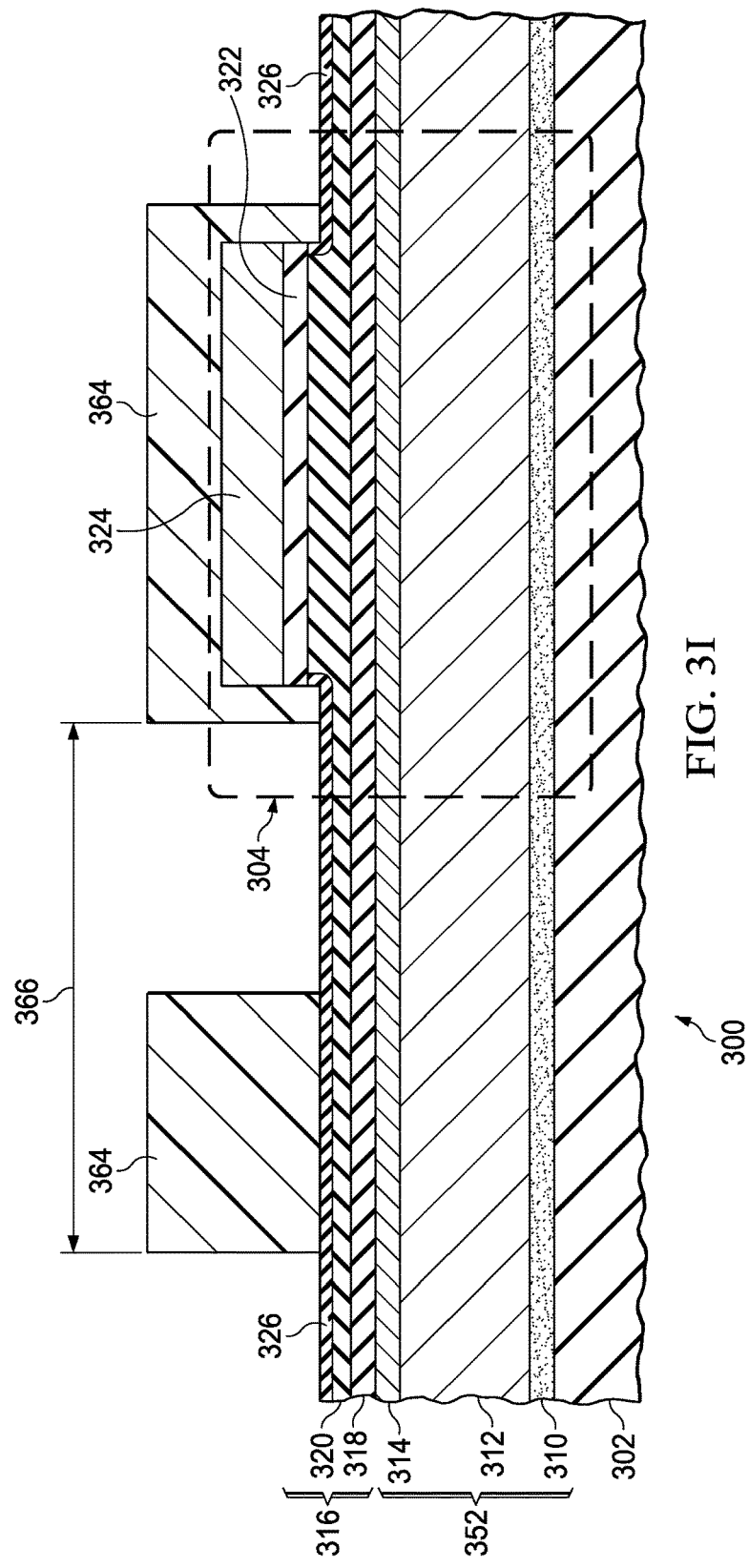
Figure 3J:
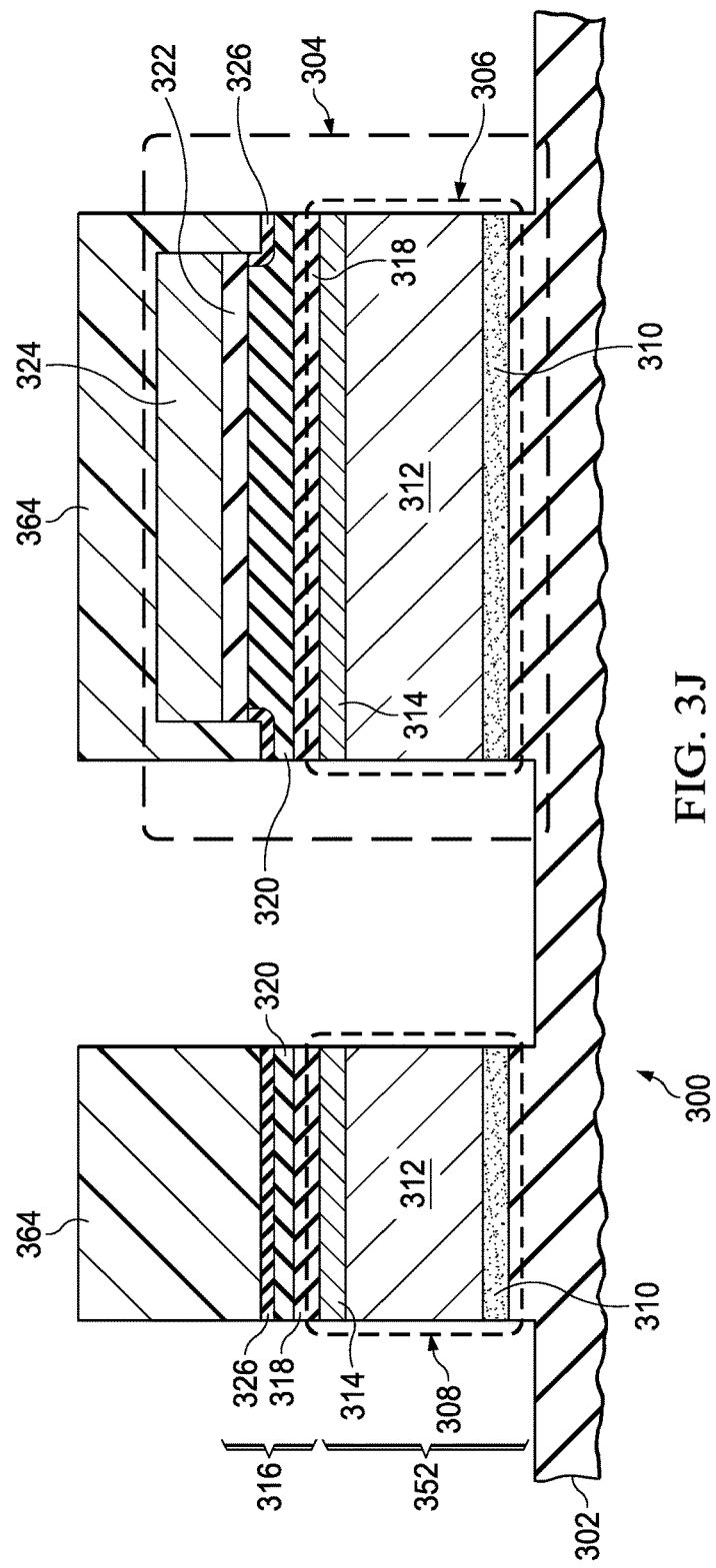
Figure 3K:
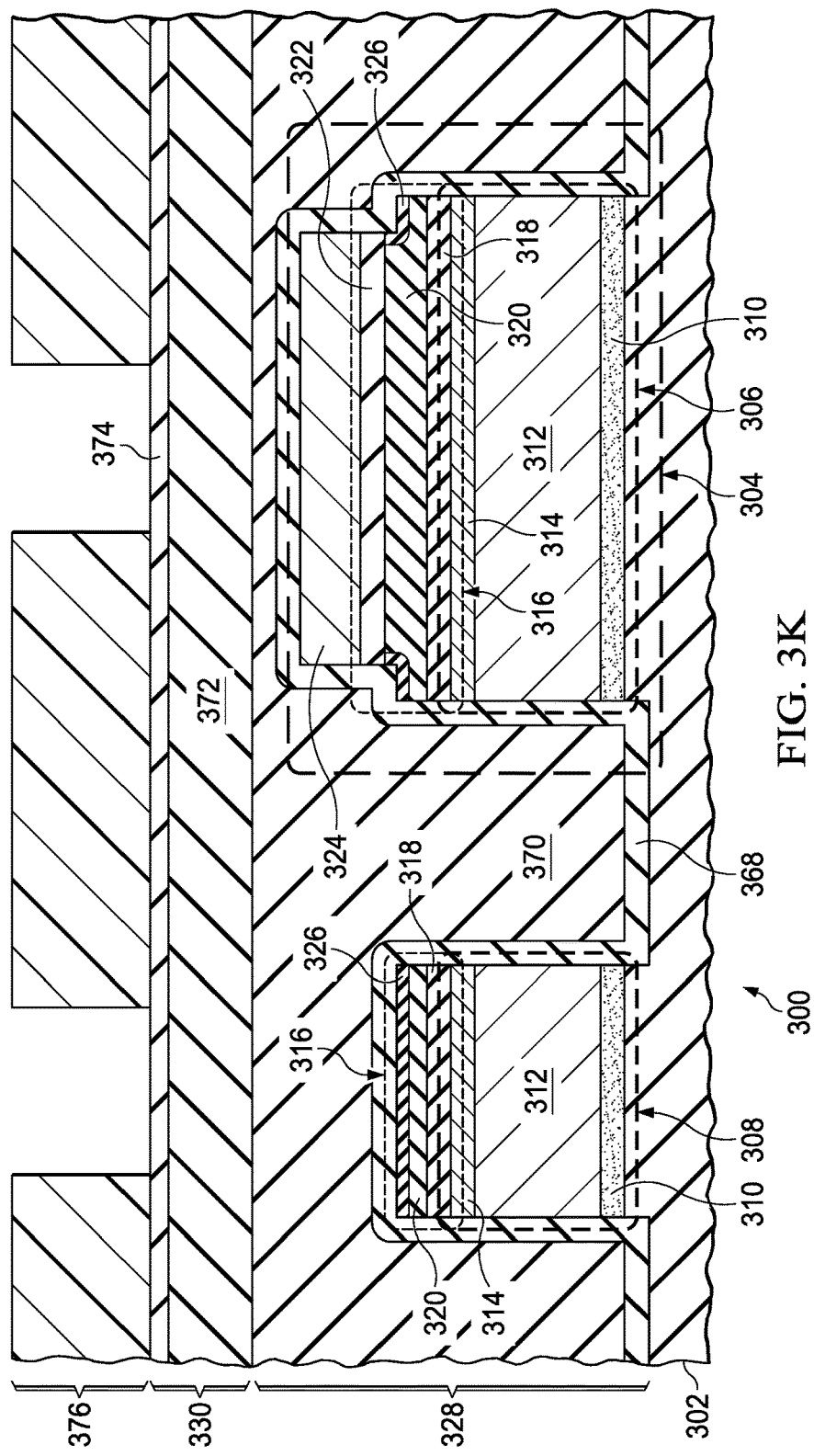
Figure 3L:
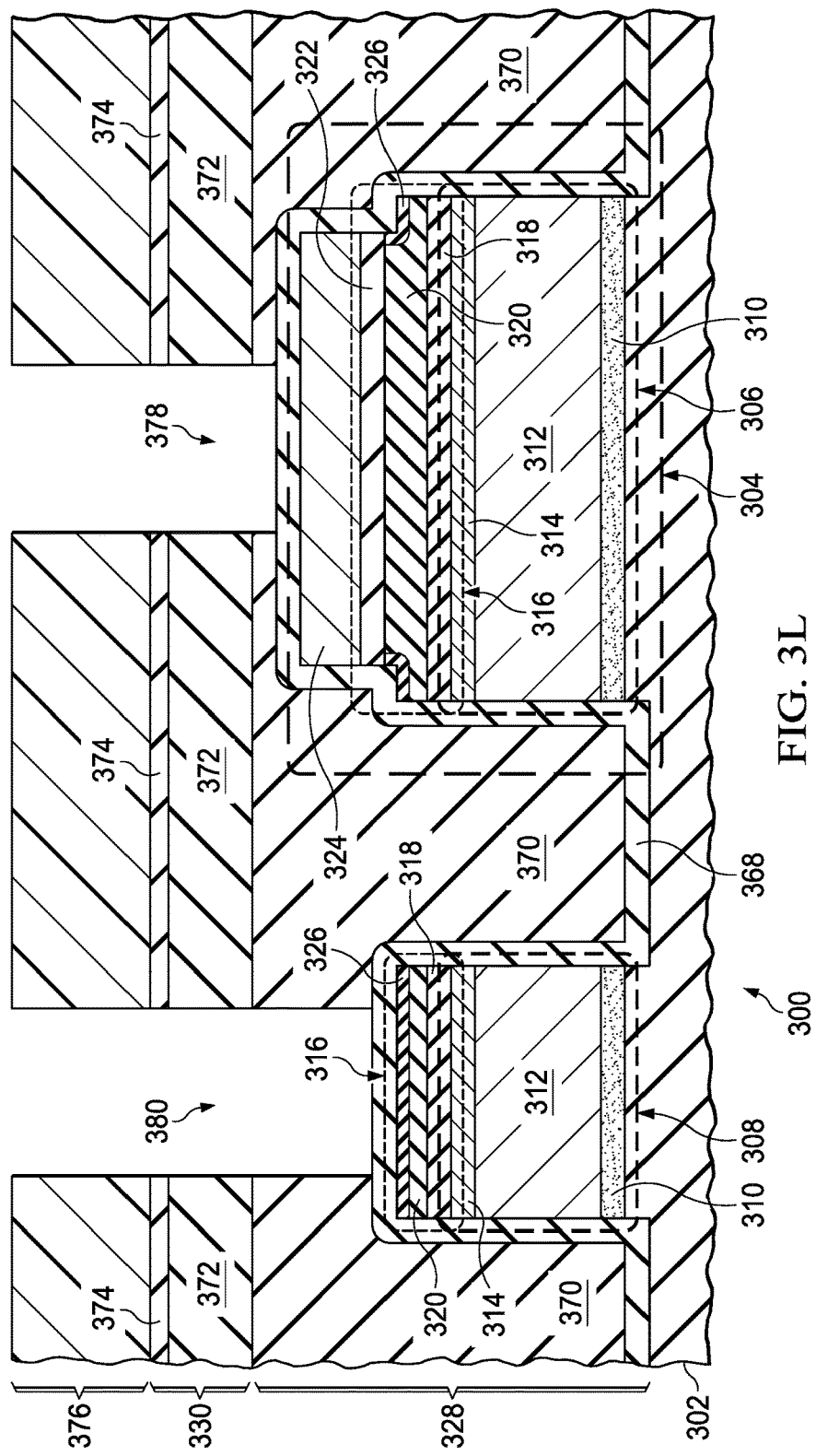
Figure 3M:
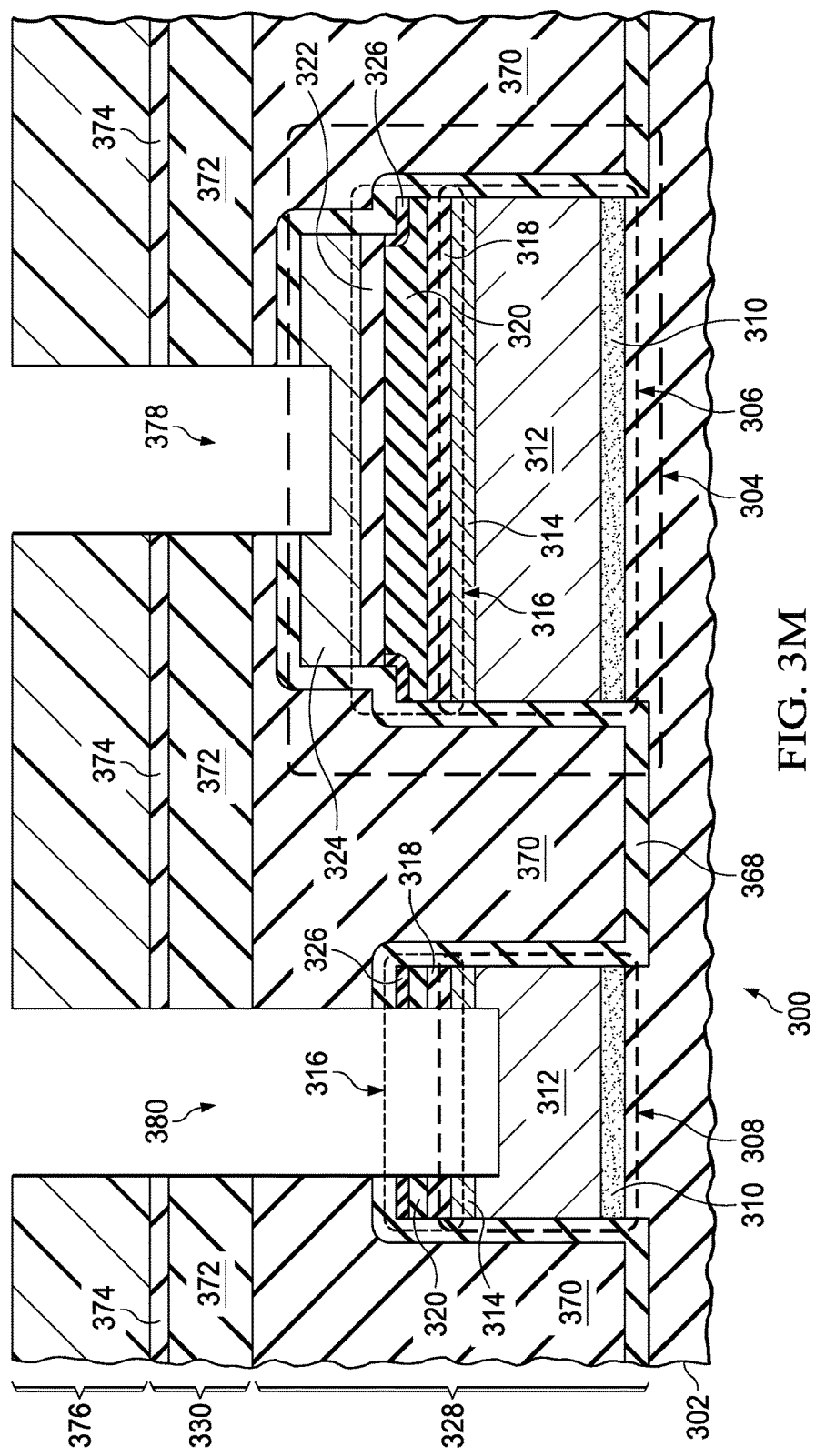
Figure 3N:
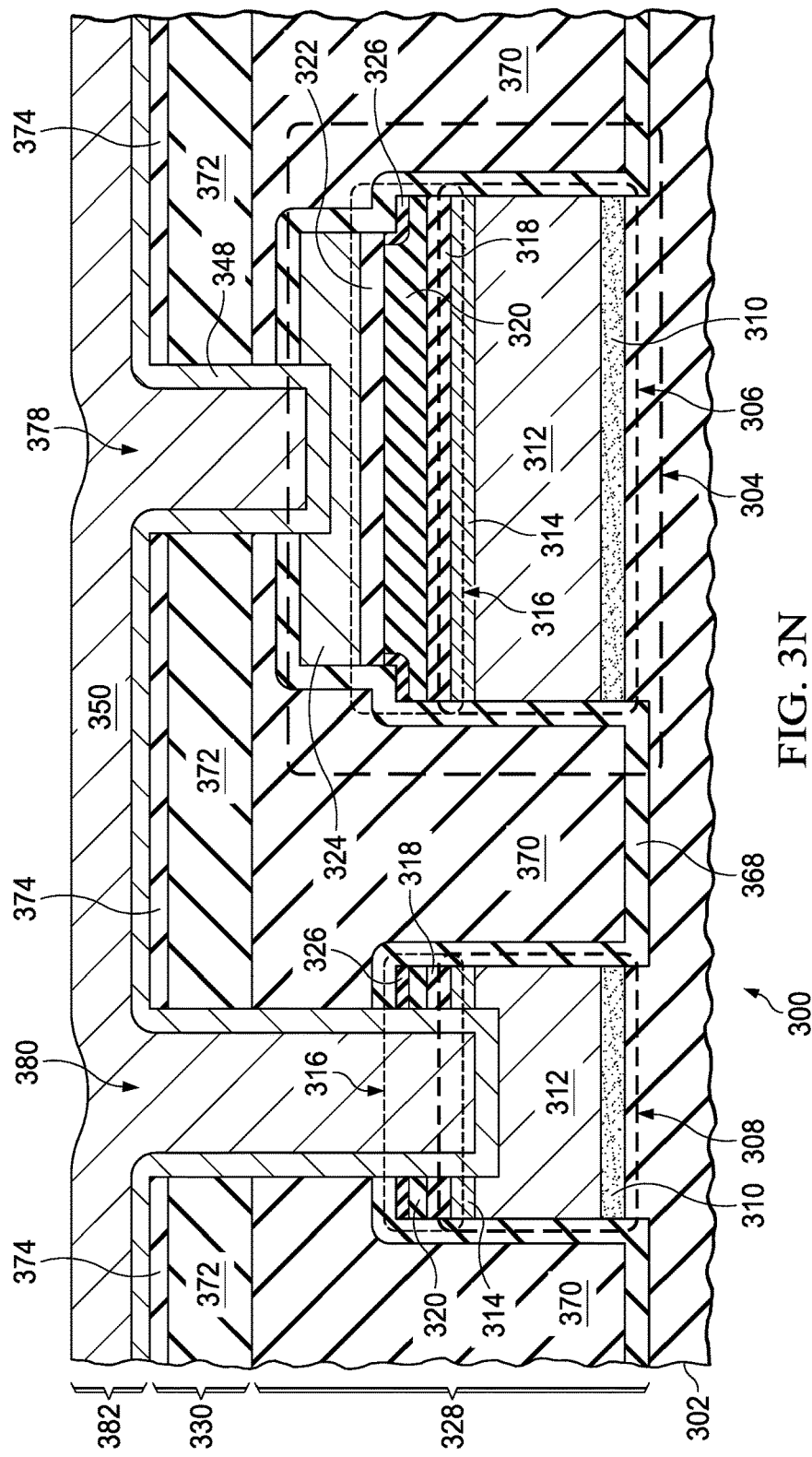
Figure 3O:
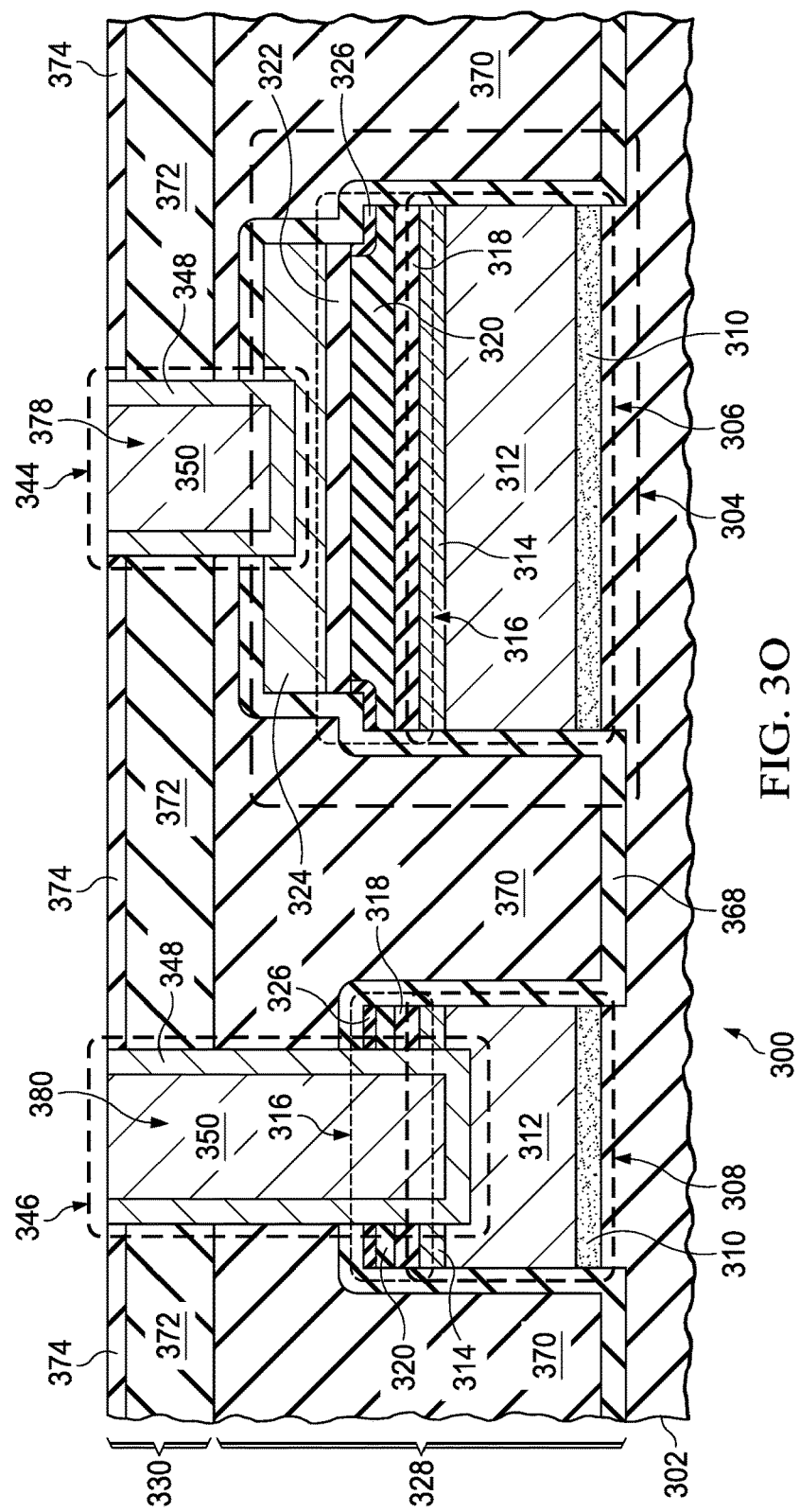

FIG. 3A through FIG. 3O are cross sections of a microelectronic device which includes a capacitor having a lower plate of interconnect metal, depicted in successive stages of an example method of formation. Values of some process parameters, such as flow rates of reagent gases and power levels of applied radio frequency (RF) power, disclosed in the instant example, are appropriate for forming the microelectronic device on a 300 millimeter diameter wafer. The values of these process parameters may be scaled appropriately for forming the microelectronic device on a different size wafer. Other process parameters, such as temperature and pressure, do not scale directly with wafer size.

Referring to FIG. 3A, the microelectronic device 300 has a lower dielectric layer 302 which may include one or more layers of dielectric material, such as a main dielectric layer of silicon dioxide, phosphosilicate glass (PSG), borophosphosilicate glass (BPSG), or low-k dielectric material, and a cap layer of silicon nitride, silicon carbide, or other material suitable for a stop layer for a chemical mechanical polish (CMP) operation. An interconnect metal layer 352 is formed over the lower dielectric layer 302. The interconnect metal layer 352 may include, for example, an adhesion layer 310 formed on the lower dielectric layer 302. The adhesion layer 310 may include titanium, titanium tungsten, or titanium nitride, or such, formed by evaporation, sputtering, or an ALD process. The interconnect metal layer 352 may include an aluminum layer 312 formed on the adhesion layer 310 by sputtering. The aluminum layer 312 may include primarily aluminum, with a few atomic percent of silicon, titanium, copper, or the like, to reduce electromigration. The interconnect metal layer 352 may further include a cap layer 314 formed on the aluminum layer 312. The cap layer 314 may include titanium nitride or such, formed by reactive sputtering, or an ALD process.

A nitrogen-rich surface layer on a top surface of the interconnect metal layer 352 may be formed by heating the microelectronic device 300 to 300° C. to 400° C., and exposing the top surface of the interconnect metal layer 352 to a nitridizing ambient 354 for 15 seconds to 60 seconds. The nitridizing ambient 354 may be provided by a plasma process using at least one nitrogen-containing gas. In the instant example, ammonia ($NH_3$) gas, denoted as "$NH_3$" in FIG. 3A, is provided at a flow rate of 400 standard cubic centimeters per minute (sccm) to 1,000 sccm, for a 300 millimeter diameter wafer. For other wafer sizes, the ammonia gas may be provided at a flow rate of 0.55 sccm to 1.0 sccm per square centimeter of wafer area. Nitrogen ($N_2$) gas, denoted as "$N_2$" in FIG. 3A is provided at a flow rate 5 to 10 times the flow rate of the ammonia gas. A pressure of the ammonia gas and the nitrogen gas is maintained at 2.5 torr to 5 torr. RF power, denoted as "RF" in FIG. 3A, is applied to the ammonia gas and the nitrogen gas at a power level of 100 watts to 200 watts, for a 300 millimeter diameter wafer, to break down the ammonia gas and the nitrogen gas to provide the nitridizing ambient 354. For other wafer sizes, the RF power may be provided at a power level of 140 milliwatts to 280 milliwatts per square centimeter of wafer area. The nitrogen-rich layer may advantageously reduce interface defects at the top surface of the interconnect metal layer 352 in the subsequently-formed capacitor, and may reduce a linear voltage coefficient of the capacitor. The nitrogen-rich layer may be difficult to detect in a physical analysis when the cap layer 314 includes nitrogen, such as in the form of titanium nitride, due to obscuration by the nitrogen in the cap layer 314.

Referring to FIG. 3B, a lower silicon dioxide layer 318 of a capacitor dielectric layer 316 is formed over the interconnect metal layer 352 without exposing the interconnect metal layer 352 to room atmosphere after exposing the top surface of the interconnect metal layer 352 to the nitridizing ambient. The phrase exposing to room atmosphere is understood to include removing the microelectronic device 300 from a process tool to a region containing room atmosphere, and to include venting the process tool containing the microelectronic device 300 to room atmosphere. The lower silicon dioxide layer 318 may be formed, for example, by a first plasma enhanced chemical vapor deposition (PECVD) process. The first PECVD process may include heating the microelectronic device 300 to 300° C. to 400° C. Silane (SiH4) gas, denoted as "$SiH_4$" in FIG. 3B, is provided at a flow rate of 30 sccm to 50 sccm, for a 300 millimeter diameter wafer. For other wafer sizes, the silane gas may be provided at a flow rate of 0.04 sccm to 0.07 sccm per square centimeter of wafer area. Nitrous oxide ($N_2O$) gas, denoted as "$N_2O$" in FIG. 3B, is provided at a flow rate 25 to 50 times the flow rate of the silane gas. A carrier gas such as helium (He) gas, denoted as "He" in FIG. 3B, is provided at a flow rate of 6,000 sccm to 10,000 sccm, for a 300 millimeter diameter wafer. For other wafer sizes, the carrier gas may be provided at a flow rate of 8.5 sccm to 14.1 sccm per square centimeter of wafer area. A pressure of the silane gas, the nitrous oxide gas, and the carrier gas is maintained at 7 torr to 10 torr. RF power, denoted as "RF" in FIG. 3B, is applied to the silane gas, the nitrous oxide gas, and the carrier gas at a power level of 250 watts to 400 watts, for a 300 millimeter diameter wafer, to break down the silane gas and the nitrous oxide gas, thus providing silicon radicals and oxygen radicals to form the lower silicon dioxide layer 318. For other wafer sizes, the RF power may be provided at a power level of 350 milliwatts to 560 milliwatts per square centimeter of wafer area. The first PECVD process may incorporate up to 5 atomic percent nitrogen in the lower silicon dioxide layer 318, from the nitrous oxide gas. The lower silicon dioxide layer 318 is 3 nanometers to 7 nanometers thick, which may require the first PECVD process to proceed for 5 seconds to 15 seconds.

In another version of the instant example, the lower silicon dioxide layer 318 may be formed by a PECVD process using nitric oxide (NO) gas instead of the nitrous oxide gas. A flow rate of the nitric oxide gas, relative to the flow rate of the silane gas, may be adjusted from the range disclosed for the nitrous oxide gas in the instant example, to form the lower silicon dioxide layer 318 with the desired stoichiometry.

Referring to FIG. 3C, a silicon oxy-nitride layer 320 of the capacitor dielectric layer 316 is formed over the lower silicon dioxide layer 318, in the same process tool, without exposing the lower silicon dioxide layer 318 to room atmosphere. The silicon oxy-nitride layer 320 may be formed, for example, by a second PECVD process. The second PECVD process may include heating the microelectronic device 300 to 300° C. to 400° C., for example the same temperature used to form the lower silicon dioxide layer 318. Silane gas, denoted as "$SiH_4$" in FIG. 3C, is provided at a flow rate of 175 sccm to 350 sccm, for a 300 millimeter diameter wafer. For other wafer sizes, the silane gas may be provided at a flow rate of 0.25 sccm to 0.50 sccm per square centimeter of wafer area. Nitrous oxide gas, denoted as "$N_2O$" in FIG. 3C, is provided at a flow rate 3 to 3.5 times the flow rate of the silane gas. A carrier gas such as helium gas, denoted as "He" in FIG. 3C, is provided at a flow rate of 7,000 sccm to 11,000 sccm, for a 300 millimeter diameter wafer. For other wafer sizes, the carrier gas may be provided at a flow rate of 9.9 sccm to 15.5 sccm per square centimeter of wafer area. A pressure of the silane gas, the nitrous oxide gas, and the carrier gas is maintained at 5 torr to 6 torr. RF power, denoted as "RF" in FIG. 3C, is applied to the silane gas, the nitrous oxide gas, and the carrier gas at a power level of 190 watts to 230 watts, for a 300 millimeter diameter wafer, to break down the silane gas and the nitrous oxide gas, thus providing silicon radicals, nitrogen radicals, and oxygen radicals to form the silicon oxy-nitride layer 320. For other wafer sizes, the RF power may be provided at a power level of 270 milliwatts to 320 milliwatts per square centimeter of wafer area. The lower silicon dioxide layer 318 is 15 nanometers to 25 nanometers thick, which may require the disclosed PECVD process to proceed for 4 seconds to 6 seconds. The silicon oxy-nitride layer 320 has an average index of refraction of 1.60 to 1.75 at a wavelength of 248 nanometers. In another version of the instant example, the silicon oxy-nitride layer 320 may be formed by a PECVD process using nitric oxide gas instead of the nitrous oxide gas. A flow rate of the nitric oxide gas, relative to the flow rate of the silane gas, may be adjusted from the range disclosed for the nitrous oxide gas in the instant example, to form the silicon oxy-nitride layer 320 with the desired index of refraction.

Referring to FIG. 3D, an upper silicon dioxide layer 322 of the capacitor dielectric layer 316 is formed on the silicon oxy-nitride layer 320. The upper silicon dioxide layer 322 may be formed, for example, by a third PECVD process using the same process parameter values as the first PECVD process disclosed in reference to FIG. 3B. The upper silicon dioxide layer 322 is formed in the same tool as the silicon oxy-nitride layer 320, without exposing the silicon oxy-nitride layer 320 to room atmosphere. The upper silicon dioxide layer 322 is 3 nanometers to 7 nanometers thick. The upper silicon dioxide layer 322 may also be formed using nitric oxide gas, as disclosed in reference to the lower silicon dioxide layer 318 of FIG. 3B.

Referring to FIG. 3E, the capacitor dielectric layer 316 may be exposed to an oxidizing ambient 356 to reduce nitrogen poisoning of photoresist in a subsequent photolithographic process to pattern the interconnect metal layer 352. The capacitor dielectric layer 316 may be exposed to the oxidizing ambient 356 in the same tool used to form the upper silicon dioxide layer 322, without exposing the capacitor dielectric layer 316 to room atmosphere. Exposure to the oxidizing ambient 356 may include heating the microelectronic device 300 to 300° C. to 400° C. The oxidizing ambient 356 may be provided by a plasma process in which nitrous oxide gas, denoted as "$N_2O$" in FIG. 3E, is provided at a flow rate of 4,000 sccm to 10,000 sccm, for a 300 millimeter diameter wafer. For other wafer sizes, the nitrous oxide gas may be provided at a flow rate of 5.6 sccm to 14.1 sccm per square centimeter of wafer area. The nitrous oxide gas is maintained at a pressure of 4 torr to 7 torr. RF power, denoted as "RF" in FIG. 3E, is applied to the nitrous oxide gas at a power level of 350 watts to 500 watts, for a 300 millimeter diameter wafer, for 10 seconds to 20 seconds, to break down the nitrous oxide gas to provide the oxidizing ambient 356. For other wafer sizes, the RF power may be provided at a power level of 495 milliwatts to 707 milliwatts per square centimeter of wafer area.

Referring to FIG. 3F, an upper plate layer 358 is formed on the capacitor dielectric layer 316. The upper plate layer 358 may include, for example, titanium nitride or tantalum nitride. The upper plate layer 358 may be formed by reactive sputtering or an ALD process. The upper plate layer 358 is sufficiently thick that a subsequent process to form a via hole over the capacitor will terminate in the upper plate layer 358 and not punch through to the capacitor dielectric layer 316. Furthermore, the upper plate layer 358 is sufficiently thin that a reactive ion etch (RIE) process to pattern the upper plate layer 358 will not remove more than half of the silicon oxy-nitride layer 320. It has been demonstrated that forming the upper plate layer 358 which includes primarily titanium nitride with a thickness of 150 nanometers to 250 nanometers thick enables attainment of both criteria.

An upper plate mask 360 is formed over the upper plate layer 358. The upper plate mask 360 covers an area for a subsequently-formed upper plate of the capacitor. The upper plate mask 360 may include photoresist formed by a photolithographic process.

Referring to FIG. 3G, material is removed from the upper plate layer 358 of FIG. 3F where exposed by the upper plate mask 360, leaving the upper plate layer 358 under the upper plate mask 360 to form an upper plate 324 of the capacitor 304. The material may be removed from the upper plate layer 358 by an RIE process using chlorine ions, or by another plasma etch process. In the instant example, the process used to form the upper plate 324 may remove the upper silicon dioxide layer 322 where exposed by the upper plate 324, and may remove a portion of the silicon oxy-nitride layer 320 where exposed by the upper silicon dioxide layer 322. At least half of the silicon oxy-nitride layer 320 remains in place where exposed by the upper silicon dioxide layer 322 after the upper plate 324 is formed.

The upper plate mask 360 is subsequently removed. The upper plate mask 360 may be removed, for example, by an asher process, followed by a wet clean process. Other methods for removing the upper plate mask 360, such as dissolution in organic solvents followed by a wet clean process, are within the scope of the instant example.

Referring to FIG. 3H, an oxidized zone 326 of the silicon oxy-nitride layer 320 is formed where exposed by the upper silicon dioxide layer 322, to reduce nitrogen poisoning in a subsequent photolithographic process to pattern the interconnect metal layer 352. The oxidized zone 326 may be formed by exposure to an oxidizing ambient 362, which may be provided as disclosed in reference to FIG. 3E. A thickness of the silicon oxy-nitride layer 320 under the oxidized zone 326 is at least half the thickness of the silicon oxy-nitride layer 320 under the upper plate 324. In other words, formation of the upper plate 324 and formation of the oxidized zone 326 leaves at least half of the silicon oxy-nitride layer 320 with an average index of refraction of 1.60 to 1.75 at a wavelength of 248 nanometers.

Referring to FIG. 3I, an interconnect mask 364 is formed over the capacitor dielectric layer 316 and the upper plate 324. The interconnect mask 364 includes photoresist, and does not include an antireflection layer. The interconnect mask 364 is formed by a photolithographic process. The capacitor dielectric layer 316 provides an anti-reflection layer for the photolithographic process. The interconnect mask 364 covers areas for subsequently-formed interconnects of the interconnect metal layer 352. A minimum pitch 366 of the interconnect mask 364, which may be expressed as a sum of a width of a segment of the interconnect mask 364 and a width of an adjacent space, may be less than 500 nanometers, wherein the photolithographic process uses an illumination source having a wavelength of 248 nanometers. Using the capacitor dielectric layer 316 as the anti-reflection layer may advantageously enable attaining a minimum pitch 366 of 500 nanometers while reducing fabrication cost and complexity of the photolithographic process. Forming a separate anti-reflection layer over the upper plate 324 would complicate patterning the interconnect mask 364 close to edges of the upper plate 324. Moreover, using the capacitor dielectric layer 316 as the anti-reflection layer may advantageously enable harmonization of the photolithographic process with a similar photolithographic process for a second microelectronic device that does not include a capacitor, wherein the similar photolithographic process uses an anti-reflection layer with similar optical characteristics to the capacitor dielectric layer 316, thus reducing fabrication complexity and costs for the fabrication facility making the microelectronic device 300 and the second microelectronic device.

Referring to FIG. 3J, the interconnect metal layer 352 is patterned by an RIE process using the interconnect mask 364 to concurrently form a lower plate 306 of the capacitor 304 and an interconnect 308. The RIE process removes the capacitor dielectric layer 316 where exposed by the interconnect mask 364. The RIE process may use fluorine-containing gases to etch the capacitor dielectric layer 316, followed by chlorine-containing gases to etch the cap layer 314 and the aluminum layer 312 of the interconnect metal layer 352. The adhesion layer 310 of the interconnect metal layer 352 may be etched by the same RIE step used to etch the aluminum layer 312.

The interconnect mask 364 is subsequently removed, leaving the capacitor dielectric layer 316 in place over the lower plate 306 where exposed by the upper plate 324 and over the interconnect 308. The interconnect mask 364 may be removed by an asher process followed by a wet clean process.

Referring to FIG. 3K, an IMD layer 328 is formed over the lower dielectric layer 302, the capacitor 304 and the interconnect 308. The IMD layer 328 includes an etch stop layer 368 of silicon nitride, silicon oxy-nitride, or such, formed on the lower dielectric layer 302, the capacitor 304 and the interconnect 308. The etch stop layer 368 may be formed by a PECVD process using bis(tertiary-butyl-amino) silane (BTBAS), to provide a nitride-containing layer with low stress. The IMD layer further includes a main dielectric layer 370 of silicon dioxide, PSG, BPSG, low-k dielectric material, or such, formed on the etch stop layer 368. The main dielectric layer 370 may be formed by a PECVD process using tetraethyl orthosilicate (TEOS). The main dielectric layer 370 may be planarized, as depicted in FIG. 3K, for example by an oxide CMP process.

An ILD layer 330 is formed on the IMD layer 328. The ILD layer 330 may include a main dielectric layer 372 of silicon dioxide or low-k dielectric material on the IMD layer 328, and a cap layer 374 of silicon nitride, silicon carbide, silicon oxy-nitride, silicon oxy-carbide, or other material appropriate for a polish stop layer for a subsequent metal CMP process, on the main dielectric layer 372.

A via mask 376 is formed over the ILD layer 330. The via mask 376 exposes areas over the capacitor 304 and the interconnect 308 for vias. The via mask 376 may include photoresist, formed by a photolithographic process, and may include an anti-reflection layer such as BARC. The via mask 376 may include hard mask material such as amorphous carbon. A vertical thickness of dielectric material of the ILD layer 330 and the IMD layer 328 over the capacitor 304 is less than a vertical thickness of the dielectric material of the ILD layer 330 and the IMD layer 328 over the interconnect 308, due to the presence of the upper plate 324 in the capacitor 304.

Referring to FIG. 3L, via holes 378 and 380 are formed through the ILD layer 330 and partway through the IMD layer 328, to the etch stop layer 368. The via holes 378 and 380 may be formed by an RIE process, using a first etch recipe to etch through the cap layer 374 of the ILD layer 330, and a second etch recipe to etch through the main dielectric layer 372 of the ILD layer 330 and the main dielectric layer 370 of the IMD layer 328. The etch stop layer 368 has a lower etch rate than the main dielectric layer 370 of the IMD layer 328, so the RIE process can etch the via hole 380 over the interconnect 308 to the etch stop layer 368 while not etching the via hole 378 over the capacitor 304 through the etch stop layer 368.

Referring to FIG. 3M, the via holes 378 and 380 are extended by the RIE process, described in reference to FIG. 3L, using a different etch recipe than that used to etch through the main dielectric layer 372 of the ILD layer 330 and the main dielectric layer 370 of the IMD layer 328. The via hole 378 over the capacitor 304 extends through the etch stop layer 368 to the upper plate 324. The via hole 380 over the interconnect 308 extends through the etch stop layer 368 and through the capacitor dielectric layer 316 to the interconnect 308.

The via mask 376 is subsequently removed. Photoresist in the via mask 376 may be removed by an asher process followed by a wet clean process. Similarly, amorphous carbon in the via mask 376 may be removed by an asher process followed by a wet clean process.

Referring to FIG. 3N, via metal 382 is formed over the ILD layer 330 so that the via metal extends into the via holes 378 and 380 and makes electrical contact to the upper plate 324 of the capacitor 304 and to the interconnect 308. The via metal 382 may include a liner 348 formed on the ILD layer 330, on sidewalls of the via holes 378 and 380, and on the upper plate 324 and the interconnect 308. The liner 348 may include a layer of titanium formed by sputtering followed by a layer of titanium nitride formed by reactive sputtering or an ALD process. The via metal 382 may further include fill metal 350 formed on the liner 348, extending into the via holes 378 and 380. The fill metal 350 may include tungsten formed by an MOCVD process using tungsten hexafluoride ($WF_6$) gas initially reduced by silane gas and then reduced by hydrogen ($H_2$) gas.

Referring to FIG. 3O, the fill metal 350 and the liner 348 are removed from over the ILD layer 330, leaving the fill metal 350 and the liner 348 in the via holes 378 and 380 to form a first via 344 making electrical contact to the upper plate 324 and a second via 346 making electrical contact to the interconnect 308. The fill metal 350 and the liner 348 may be removed from over the ILD layer 330 by a metal CMP process. The cap layer 374 may have a low polish rate in the metal CMP process, enabling complete removal of the fill metal 350 and the liner 348 from over the ILD layer 330 without removing any of the main dielectric layer 372 of the ILD layer 330. Forming the vias 344 and 346 concurrently through the ILD layer 330 enables subsequently-formed interconnects on the ILD layer 330 to be electrically connected to the capacitor 304 and the interconnect 308, which may advantageously simplify fabrication of the microelectronic device 300, compared to forming separate vias to the capacitor 304 and the interconnect 308.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a lower dielectric layer; and a capacitor, including:
  a lower plate over the lower dielectric layer;
  a capacitor dielectric layer on the lower plate, the capacitor dielectric layer including:
    a lower silicon dioxide layer on the lower plate;
    a silicon oxy-nitride layer on the lower silicon dioxide layer, the silicon oxy-nitride layer having an average value of the real part of the index of refraction of 1.60 to 1.75 at a wavelength of 248 nanometers; and
    a upper silicon dioxide layer on the silicon oxy-nitride layer; and
  an upper plate on the upper silicon dioxide layer, wherein the upper plate is recessed from a lateral perimeter of the lower plate, the capacitor dielectric layer providing an anti-reflection layer.

2. The microelectronic device of claim 1, wherein:
the lower silicon dioxide layer has a thickness of 3 nanometers to 7 nanometers;
the silicon oxy-nitride layer has a thickness of 15 nanometers to 25 nanometers; and
the upper silicon dioxide layer has a thickness of 3 nanometers to 7 nanometers.

3. The microelectronic device of claim 1, wherein:
the upper plate includes primarily titanium nitride;
the upper plate has a thickness of 150 nanometers to 250 nanometers; and
the lower silicon dioxide layer and at least a portion of the silicon oxy-nitride layer extend past the upper plate on the lower plate, wherein the silicon oxy-nitride layer which extends past the upper plate has a thickness that is at least half the thickness of the silicon oxy-nitride layer under the upper plate.

4. The microelectronic device of claim 3, wherein:
the upper silicon dioxide layer does not extend past the upper plate; and
the silicon oxy-nitride layer which extends past the upper plate has an oxidized zone that is 2 nanometers to 8 nanometers thick, extending from a top surface of the silicon oxy-nitride layer.

5. The microelectronic device of claim 1, wherein the lower plate includes:
an aluminum layer which includes primarily aluminum; and
a cap layer on the aluminum layer, the cap layer including titanium nitride.

6. The microelectronic device of claim 1, further comprising an interconnect on the lower dielectric layer separate from the lower plate, wherein:
the interconnect has a similar structure and a similar composition to the lower plate; and
the lower silicon dioxide layer and at least a portion of the silicon oxy-nitride layer extend across a top surface of the interconnect.

7. The microelectronic device of claim 6, further comprising:
an intra-metal dielectric (IMD) layer over the capacitor and the interconnect;
a first upper interconnect over the IMD layer and above the upper plate;
a second upper interconnect over the IMD layer and above the interconnect;
a first via connecting the first upper interconnect to the upper plate, the first via having a first liner and a first fill metal on the first liner; and
a second via connecting the second upper interconnect to the interconnect, the second via having a second liner and a second fill metal on the second liner;
wherein the first liner and the second liner have similar compositions, and the first fill metal and the second fill metal have similar compositions.

8. The microelectronic device of claim 1, further comprising:
an IMD layer over the capacitor;
a first upper interconnect over the IMD layer and above the upper plate;
a second upper interconnect over the IMD layer and above a portion of the lower plate extending past the upper plate;
a first via connecting the first upper interconnect to the upper plate, the first via having a first liner and a first fill metal on the first liner; and
a second via connecting the second upper interconnect to the lower plate, the second via having a second liner and a second fill metal on the second liner;
wherein the first liner and the second liner have similar compositions, and the first fill metal and the second fill metal have similar compositions.

9. A method, comprising:
forming a lower dielectric layer of a microelectronic device;
forming an interconnect metal layer over the lower dielectric layer;
forming a capacitor dielectric layer of a capacitor on the interconnect metal layer, comprising:
  exposing the interconnect metal layer to a nitridizing ambient by a plasma process using a nitrogen-containing gas;
  forming a lower silicon dioxide layer on the interconnect metal layer;
  forming a silicon oxy-nitride layer on the lower silicon dioxide; and
  forming an upper silicon dioxide layer on the silicon oxy-nitride layer;
forming an upper plate layer on the capacitor dielectric layer;
patterning the upper plate layer to form an upper plate of the capacitor, wherein the lower silicon dioxide layer and at least half the silicon oxy-nitride layer are left on the interconnect metal layer where exposed by the upper plate;
forming an interconnect mask of photoresist over the interconnect metal layer and the upper plate by a photolithographic process, wherein the lower silicon dioxide layer and the at least half the silicon oxy-nitride layer on the interconnect metal layer provide an anti-reflection layer for the photolithographic process;
removing the interconnect metal layer where exposed by the interconnect mask to concurrently form a lower plate of the capacitor under the upper plate and form an interconnect separate from the lower plate; and
removing the interconnect mask.

10. The method of claim 9, wherein forming the interconnect metal layer includes:
forming an aluminum layer over the lower dielectric layer, the aluminum layer including primarily aluminum; and
forming a cap layer on the aluminum layer, the cap layer including titanium nitride.

11. The method of claim 9, wherein exposing the interconnect metal layer to the nitridizing ambient includes:
heating the microelectronic device to 300° C. to 400° C.;

providing ammonia (NH$_3$) gas at a flow rate of 0.55 standard cubic centimeters per minute (sccm) to 1.0 sccm per square centimeter of wafer area of a wafer containing the microelectronic device;

providing nitrogen (N$_2$) gas at a flow rate 5 to 10 times the flow rate of the ammonia gas;

maintaining a pressure of the ammonia gas and the nitrogen gas at 2.5 torr to 5 torr; and providing radio frequency (RF) power to the ammonia gas and the nitrogen gas at a power level of 140 milliwatts to 280 milliwatts per square centimeter of the wafer area.

12. The method of claim 9, wherein forming the lower silicon dioxide layer includes a plasma enhanced chemical vapor deposition (PECVD) process using silane gas and nitrous oxide gas.

13. The method of claim 12, wherein forming the lower silicon dioxide layer includes:

heating the microelectronic device to 300° C. to 400° C.;

providing silane (SiH$_4$) gas at a flow rate of 0.04 sccm to 0.07 sccm per square centimeter of wafer area of a wafer containing the microelectronic device;

providing nitrous oxide (N$_2$O) gas at a flow rate 25 to 50 times the flow rate of the silane gas;

providing a carrier gas at a flow rate of 8.5 sccm to 14.1 sccm per square centimeter of wafer area of a wafer containing the microelectronic device;

maintaining a pressure of the silane gas, the nitrous oxide gas, and the carrier gas at 7 torr to 10 torr; and providing RF power to the ammonia gas and the nitrogen gas at a power level of 350 milliwatts to 560 milliwatts per square centimeter of the wafer area.

14. The method of claim 9, wherein forming the silicon oxy-nitride layer includes a PECVD process using silane gas and nitrous oxide gas.

15. The method of claim 14, wherein forming the silicon oxy-nitride layer includes:

heating the microelectronic device to 300° C. to 400° C.;

providing silane gas at a flow rate of 0.25 sccm to 0.50 sccm per square centimeter of wafer area of a wafer containing the microelectronic device;

providing nitrous oxide gas at a flow rate 3 to 3.5 times the flow rate of the silane gas;

providing a carrier gas at a flow rate of 9.9 sccm to 15.5 sccm per square centimeter of wafer area of a wafer containing the microelectronic device;

maintaining a pressure of the silane gas, the nitrous oxide gas, and the carrier gas at 5 torr to 6 torr; and providing RF power to the ammonia gas and the nitrogen gas at a power level of 270 milliwatts to 320 milliwatts per square centimeter of the wafer area.

16. The method of claim 9, wherein the silicon oxy-nitride layer is 15 nanometers to 25 nanometers thick.

17. The method of claim 9, wherein forming the upper silicon dioxide layer includes a PECVD process using silane gas and nitrous oxide gas.

18. The method of claim 17, wherein forming the upper silicon dioxide layer includes:

heating the microelectronic device to 300° C. to 400° C.;

providing silane gas at a flow rate of 0.04 sccm to 0.07 sccm per square centimeter of wafer area of a wafer containing the microelectronic device;

providing nitrous oxide gas at a flow rate 25 to 50 times the flow rate of the silane gas;

providing a carrier gas at a flow rate of 8.5 sccm to 14.1 sccm per square centimeter of wafer area of a wafer containing the microelectronic device;

maintaining a pressure of the silane gas, the nitrous oxide gas, and the carrier gas at 7 torr to 10 torr; and providing RF power to the ammonia gas and the nitrogen gas at a power level of 350 milliwatts to 560 milliwatts per square centimeter of the wafer area.

19. The method of claim 9, wherein the upper silicon dioxide layer is 3 nanometers to 7 nanometers thick.

20. The method of claim 9, further comprising forming an oxidized zone in the silicon oxy-nitride layer where exposed by the upper plate, the oxidized zone, wherein a thickness of the silicon oxy-nitride layer under the oxidized zone is at least half the thickness of the silicon oxy-nitride layer under the upper plate.

21. The method of claim 9, wherein the silicon oxy-nitride layer has an average value of the real part of the index of refraction of 1.60 to 1.75 at a wavelength of 248 nanometers.

* * * * *